United States Patent
Leung et al.

(10) Patent No.: US 6,898,140 B2
(45) Date of Patent: May 24, 2005

(54) METHOD AND APPARATUS FOR TEMPERATURE ADAPTIVE REFRESH IN 1T-SRAM COMPATIBLE MEMORY USING THE SUBTHRESHOLD CHARACTERISTICS OF MOSFET TRANSISTORS

(75) Inventors: Wingyu Leung, Cupertino, CA (US); Jae-Kwang Sim, Sunnyvale, CA (US)

(73) Assignee: Monolithic System Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/300,427

(22) Filed: Nov. 20, 2002

(65) Prior Publication Data

US 2003/0067830 A1 Apr. 10, 2003

Related U.S. Application Data

(63) Continuation-in-part of application No. 10/114,282, filed on Apr. 3, 2002, now Pat. No. 6,707,743, which is a continuation-in-part of application No. 09/846,093, filed on Apr. 3, 2001, now Pat. No. 6,504,780, which is a continuation-in-part of application No. 09/405,607, filed on Sep. 24, 1999, now Pat. No. 6,415,353, which is a continuation-in-part of application No. 09/165,228, filed on Oct. 1, 1998, now Pat. No. 5,999,474.

(51) Int. Cl.$^7$ .................................................. G11C 7/00
(52) U.S. Cl. ...................... 365/222; 365/149; 365/210
(58) Field of Search ................................ 365/222, 149, 365/189.09, 194, 210, 230.03

(56) References Cited

U.S. PATENT DOCUMENTS

| | | | |
|---|---|---|---|
| 4,330,852 A | 5/1982 | Redwine et al. | |
| 4,549,284 A | 10/1985 | Ikuzaki | |
| 4,625,301 A | 11/1986 | Berger | |

(Continued)

FOREIGN PATENT DOCUMENTS

| | | |
|---|---|---|
| EP | 0588250 | 3/1994 |
| EP | 0794497 | 9/1997 |
| EP | 0811979 | 12/1997 |
| EP | 0942430 A1 | 9/1999 |
| GB | 2265035 A | 9/1993 |
| JP | 58048293 | 3/1983 |
| JP | 3-289232 | * 12/1991 |
| WO | 98/19309 | 5/1998 |

OTHER PUBLICATIONS

"HYB/E 25L128160AC, 128–Mbit Mobile–RAM" by Infineon Technologies; Dec., 2001.

"Analog Integrated Circuit Design" by David A. Johns and Ken Martin, John Wiley and Sons Inc., 1997, Chapter 5, pp. 248–250.

"Mobile RAM"; Application Note, V1.1, Feb. 2002 by Infineon Technologies; pp. 1–7.

(Continued)

Primary Examiner—Van Thu Nguyen
(74) Attorney, Agent, or Firm—Bever, Hoffman & Harms, LLP; E. Eric Hoffman

(57) ABSTRACT

A memory system is provided that includes an array of memory cells that require periodic refresh, and a temperature-adaptive refresh controller. Data retention time of the memory cells decreases exponentially as temperature increases. The temperature-adaptive refresh controller selects the refresh period of the memory cells in response to the subthreshold current of a reference transistor. The subthreshold current of the reference transistor increases exponentially as temperature increases As a result, the refresh period is empirically tied to the data retention time. Consequently, the power required for refresh operations decreases as temperature decreases. Power is therefore conserved in applications that operate predominantly at room temperature.

24 Claims, 16 Drawing Sheets

U.S. PATENT DOCUMENTS

| | | | |
|---|---|---|---|
| 4,758,993 A | * | 7/1988 | Takemae ............... 365/222 |
| 4,839,867 A | | 6/1989 | Poehnitzsch |
| 4,999,814 A | | 3/1991 | Hashimoto |
| 5,033,027 A | | 7/1991 | Amin |
| 5,193,072 A | | 3/1993 | Frenkil et al. |
| 5,295,109 A | | 3/1994 | Nawaki |
| 5,450,364 A | | 9/1995 | Stephens, Jr. et al. |
| 5,471,601 A | | 11/1995 | Gonzales |
| 5,511,033 A | | 4/1996 | Jung |
| 5,544,120 A | | 8/1996 | Kuwagata et al. |
| 5,559,750 A | | 9/1996 | Dosaka et al. |
| 5,583,823 A | | 12/1996 | Park |
| 5,586,287 A | | 12/1996 | Okumura et al. |
| 5,642,320 A | | 6/1997 | Jang |
| 5,652,729 A | * | 7/1997 | Iwata et al. ............. 365/222 |
| 5,659,515 A | | 8/1997 | Matsuo |
| 5,721,862 A | | 2/1998 | Sartore et al. |
| 5,748,547 A | | 5/1998 | Shau |
| 5,784,705 A | | 7/1998 | Leung |
| 5,802,555 A | | 9/1998 | Shigeeda |
| 5,822,265 A | | 10/1998 | Zdenek |
| 5,828,619 A | | 10/1998 | Hirano et al. |
| 5,829,026 A | | 10/1998 | Leung |
| 5,835,401 A | | 11/1998 | Green et al. |
| 5,859,809 A | | 1/1999 | Kim |
| 5,873,114 A | | 2/1999 | Rahman et al. |
| 5,875,452 A | | 2/1999 | Katayama et al. |
| 5,940,851 A | | 8/1999 | Leung |
| 5,999,474 A | | 12/1999 | Leung et al. |
| 6,028,804 A | | 2/2000 | Leung |
| 6,075,740 A | | 6/2000 | Leung |
| 6,195,303 B1 | | 2/2001 | Zheng |
| 6,222,785 B1 | | 4/2001 | Leung |
| 6,246,619 B1 | | 6/2001 | Ematrudo et al. |
| 6,259,651 B1 | | 7/2001 | Leung |
| 6,282,606 B1 | | 8/2001 | Holland |
| 6,366,989 B1 | | 4/2002 | Keskar et al. |
| 6,449,203 B1 | | 9/2002 | Cowles et al. |
| 6,452,852 B2 | * | 9/2002 | Bohm et al. ............. 365/222 |
| 6,496,437 B2 | | 12/2002 | Leung |
| 6,504,780 B2 | | 1/2003 | Leung |
| 2003/0081484 A1 | * | 5/2003 | Kobayashi et al. ......... 365/222 |
| 2003/0189859 A1 | * | 10/2003 | Takahashi et al. ......... 365/200 |

OTHER PUBLICATIONS

Toshiba Corporation, "Toshiba MOS Digital Integrated Circuit," Toshiba Integrated Circuit Technical Data, Toshiba Corporation, p. 1–18, ( Sep. 2, 1996).

Kazushige Ayukawa et al., "An Access–Sequence Control Scheme to Enhance Random–Access Performance of Embedded DRAM's," IEEE Journal of Solid–State Circuits, IEEE, vol. 33 ( No. 5), p. 800–806, ( Feb. 5, 1998).

16Mbit Enhanced SDRAM Family 4M×4, XM×8, 1M×16, Enhanced Memory Systems, Inc., Enhanced Memory Systems, Inc. (Colorado Springs), p. 1–8, (Feb. 4, 1997).

MD904 to MD920 . . . (1996) DS01–2.4–Feb. 21, 1997, MoSys, Inc.

16Mbit Synchronous DRAM, Revised May 1996, p. 1–100, IBM Corporation.

Direct Rambus Technology Disclosure, 1997, pp. 1–48, Rambus, Inc.

IMb ×4 Enhanced Dynamic RAM, pp. 2–17 to 2–33, Ramtron International. Corporation.

Dynamic CMOS Ram, pp. 6–101 to 6–113, NEC Electronics, Inc.

Pentium Processor 3.3V Pipelined BSRAM Specification, Ver. 2.0, May 25, 1995, Intel Corporation.

SLDRAM Consortium, "400 Mb/s/pin SLDRAM", pp. 1–59 (author unknown).

* cited by examiner

US 6,898,140 B2

METHOD AND APPARATUS FOR TEMPERATURE ADAPTIVE REFRESH IN 1T-SRAM COMPATIBLE MEMORY USING THE SUBTHRESHOLD CHARACTERISTICS OF MOSFET TRANSISTORS

RELATED APPLICATIONS

The present application is a continuation-in-part of U.S. patent application Ser. No. 10/114,282, by Wingyu Leung and Jae-Kwang Sim, entitled "METHOD AND APPARATUS FOR COMPLETELY HIDING REFRESH OPERATIONS IN A DRAM DEVICE USING MULTIPLE CLOCK DIVISION" filed Apr. 3, 2002, now U.S. Pat. No. 6,707,743, which is a continuation-in-part of U.S. patent application Ser. No. 09/846,093, by Wingyu Leung, entitled "Method And Apparatus For Completely Hiding Refresh Operations In A DRAM Device Using Clock Division" filed Apr. 30, 2001, now U.S. Pat. No. 6,504,780, which is a continuation-in-part of U.S. patent application Ser. No. 09/405,607, by Wingyu Leung, entitled "Read/Write Buffers for Complete Hiding of the Refresh of a Semiconductor Memory and Method of Operating Same" filed Sep. 24, 1999, now U.S. Pat. No. 6,415,353, which is a continuation-in-part of U.S. patent application Ser. No. 09/165,228, filed Oct. 1, 1998, now U.S. Pat. No. 5,999,474, by Wingyu Leung and Fu-Chieh Hsu, entitled "Method and Apparatus for Complete Hiding of the Refresh of a Semiconductor Memory" issued Dec. 7, 1999.

The present application is further related to U.S. Pat. No. 6,028,804, by Wingyu Leung, entitled "Method and Apparatus for 1-T SRAM Compatible Memory" and issued Feb. 22, 2000; U.S. Pat. No. 6,222,785, by Wingyu Leung, entitled "Method and Apparatus For Refreshing A Semiconductor Memory Using Idle Memory Cycles" issued Apr. 24, 2001; and U.S. Pat. No. 6,075,740, by Wingyu Leung, entitled "Method and Apparatus for Increasing The Time Available for Refresh For 1-T SRAM Compatible Devices", issued Jun. 13, 2000. These patents are hereby incorporated by reference.

FIELD OF THE INVENTION

The present invention is related to semiconductor memories, especially dynamic random access memory (DRAM). In particular, the present invention relates to a method and apparatus of handling refresh operations in a semiconductor memory such that the refresh operations do not interfere with external access operations, and wherein the refresh period is modified in response to temperature.

DISCUSSION OF RELATED ART

A conventional DRAM memory cell, which consists of one transistor and one capacitor, is significantly smaller than a conventional SRAM cell, which consists of 4 to 6 transistors. However, data stored in a DRAM cell must be periodically refreshed, while the data stored in an SRAM cell has no such requirement. Each refresh operation of a DRAM cell consumes memory bandwidth. It is possible for an external access to be initiated at the same time that a refresh access is required. In this case, the external access must be delayed until after the refresh access has been performed. In general, this prevents DRAM cells from being operated as SRAM cells, because SRAM cells do not require refresh operations.

Previous attempts to use DRAM cells in SRAM applications have been of limited success for various reasons. For example, one such DRAM device has required an external signal to control refresh operations. (See, 131,072-Word by 8-Bit CMOS Pseudo Static RAM, Toshiba Integrated Circuit Technical Data (1996).) Moreover, external accesses to this DRAM device are delayed during the memory refresh operations. As a result, the refresh operations are not transparent and the resulting DRAM device cannot be fully compatible with an SRAM device.

In another prior art scheme, a high-speed SRAM cache is used with a relatively slow DRAM array to speed up the average access time of the memory device. (See, U.S. Pat. No. 5,559,750 by Katsumi Dosaka et al, and "Data Sheet of 16 Mbit Enhanced SDRAM Family 4M×4, 2M×8, 1M×16" by Enhanced Memory Systems Inc., 1997.) The actual access time of the device varies depending on the cache hit rate. Circuitry is provided to refresh the DRAM cells. However, the refresh operation is not transparent to external accesses. That is, the refresh operations affect the memory access time. Consequently, the device cannot meet the requirement of total deterministic random access time.

Other prior art schemes use multi-banking to reduce the average access time of a DRAM device. Examples of multi-banking schemes are described in "Data sheet, MD904 To MD920, Multi-bank DRAM (MDRAM) 128K× 32 to 656K×32" by MoSys Inc. 1996, and in "An Access-Sequence Control Scheme to Enhance Random-Access Performance of Embedded DRAM's" by Kazushige Ayukawa et al, IEEE JSSC, vol. 33, No. 5, May 1998, pp. 800–806. These multi-banking schemes do not allow an individual memory bank to delay a refresh cycle.

Another prior art scheme uses a read buffer and a write buffer to take advantage of the sequential or burst nature of an external access. An example of such a prior art scheme is described in U.S. Pat. No. 5,659,515, entitled "Semiconductor Memory Device Capable of Refresh Operation in Burst Mode" by R. Matsuo and T. Wada. In this scheme, a burst access allows a register to handle the sequential accesses of a transaction while the memory array is being refreshed. However, this scheme does not allow consecutive random accesses. For example, the memory cannot handle a random access per clock cycle.

Another prior art scheme that attempts to completely hide refresh operations in a DRAM cell includes the scheme described in U.S. Pat. No. 5,642,320, entitled "Self-Refreshable Dual Port Dynamic CAM Cell and Dynamic CAM Cell Array Refreshing Circuit", by H. S. Jang. In this scheme, a second port is added to each of the dynamic memory cells so that refresh can be performed at one port while a normal access is carried out at the other port. The added port essentially doubles the access bandwidth of the memory cell, but at the expense of additional silicon area.

Another prior art scheme that attempts to completely hide the refresh operations in an asynchronous DRAM is described in U.S. Pat. No. 4,549,284, entitled "Dynamic MOS Random Access Memory", by Kunihiko Ikuzaki. In this scheme, an automatic refresh circuit is incorporated in an asynchronous DRAM to generate a refresh cycle after an external access cycle is performed. In the absence of an external access, an internal oscillator continues to generate refresh cycles. Thus, the memory device is constantly performing refresh operations, thereby wasting power.

Moreover, the oscillation period of the oscillator is set by the transconductance of an MOS transistor and a capacitor, which varies with process and temperature. Within a typical process and commercial temperature range, the oscillation period varies by up to a factor of two. As a result, it becomes difficult to synchronize the external accesses and the refresh operations. For this reason, the memory device is not suitable for high-speed operations in the auto-refresh mode.

In addition, many DRAM devices, such as synchronous DRAM devices, incorporate a self-refresh circuit to retain data automatically. The self-refresh mode, however, must be explicitly triggered so that the self-refresh operations do not interfere with read or write accesses. These memory devices typically use a timer that generates a periodic signal for carrying out the internal refresh operation under the self-refresh mode. The periodic signal does not track with the temperature characteristics of the data retention time of the memory cells. Because the periodic signal for carrying out the internal refresh operations does not track with the data retention characteristics of the memory cells, the self-refresh power of the memory device is not optimized with temperature variations.

A data sheet entitled "HYB/E 25L128160AC, 128-MBit Mobile-RAM" by Infineon Technologies (December 2001), describes a temperature compensated self-refresh scheme in which the refresh rate is adjusted in response to the temperature of the device. In this scheme, the refresh rate can be increased as the temperature increases. However, the described RAM is not capable of handling a random access per clock cycle nor can the self-refresh be executed without interfering with external access.

Accordingly, it would be desirable to have a DRAM device that handles refresh operations in a manner that is completely transparent to an external accessing memory client for both low-speed and high-speed operations. It would further be desirable if such a DRAM device only performed refresh operations at the times when the memory cells need to be refreshed (i.e., at a rate determined mainly by the charge leakage mechanism of the memory cells, and not by the circuit operation of the automatic refresh circuit). It would further be desirable for such a DRAM device to have a self-refresh rate that varies with temperature, wherein the variation substantially matches the temperature variation of the memory-cell leakage current.

SUMMARY

Accordingly, the present embodiment provides a memory device (or an embedded memory block) that includes a plurality of memory cells, which must be periodically refreshed in order to retain data values. In one embodiment, the memory cells are DRAM cells arranged in an array having a plurality rows and columns. In a particular embodiment, the array is divided into a plurality of banks.

The memory device includes a plurality of terminals for receiving signals from an external accessing client. These signals can include a clock signal, an address signal, a write/read indicator signal, and address strobe signal and a reset signal. However, these signals do not include a signal that indicates that a refresh operation must be performed.

To implement refresh operations, the memory device includes a refresh controller that periodically asserts a refresh request signal, which is used to indicate that a refresh operation is pending. The refresh controller also provides a refresh address identifying one of the rows of the array. The refresh controller increments the refresh address each time that the refresh request signal is asserted.

The memory device also includes a memory array sequencer for controlling the timing of external accesses and refresh accesses within the memory device. In general, the memory array sequencer ensures that the required refresh accesses are performed without interfering with any external accesses.

More specifically, the memory array sequencer synchronizes external accesses and refresh accesses with different edges of an external clock signal. In one embodiment, external accesses are synchronized (initiated) in response to rising edges of the external clock signal. The external accesses are then completed during the first half cycle of the clock period (e.g., while the clock signal has a high state). In this embodiment, pending refresh accesses are synchronized (initiated) in response to falling edges of the external clock signal. The refresh accesses are then completed during the second half cycle of the clock period (e.g., while the clock signal has a low state).

In another embodiment, external accesses are synchronized (initiated) in response to rising edges of the external clock signal. The external accesses are performed as quickly as possible. Pending refresh accesses are then synchronized (initiated) in response to the end of the external accesses. The refresh accesses are completed prior to the next rising edge of the external clock signal. This embodiment allows the external accesses and refresh accesses to be performed as quickly as possible, without being dependent on the duty cycle of the external clock signal.

In yet another embodiment, a clock division scheme is implemented to allow N external accesses and one refresh operation to be performed during N consecutive clock cycles. In this embodiment, the memory system can include a memory array sequencer configured to enable N external accesses and one refresh access to be consecutively performed during N cycles of the clock signal, wherein N is an integer equal to two or more. This memory system can include a clock divider circuit configured to provide a divided clock signal that is activated for one period of every N periods of the clock signal, and means for initiating the refresh access only when the divided clock signal is activated.

A corresponding method includes the steps of operating the memory system in response to a clock signal, and enabling N external accesses and one refresh access to be consecutively performed during N cycles of the clock signal, wherein N is an integer equal to two or more. In one embodiment, the clock signal is divided to create a divided clock signal that is activated for one period of every N periods of the clock signal, and a refresh access only enabled when the divided clock signal is activated.

The refresh access can be performed at the beginning of the N cycle period. Alternately, the refresh access can be performed only during the second half of one of the N cycles of the clock signal. In another variation, each of the N external accesses is initiated only during a first half of a corresponding one of the N cycles. In another variation, the refresh access is initiated in response to an end of a first one of the N external accesses, and a second one of the N external accesses is initiated in response to an end of the refresh access.

In accordance with another embodiment, a DRAM device or an embedded DRAM block includes a temperature-adaptive refresh controller, which implements self-refresh of the memory without interfering with external accesses. The temperature-adaptive refresh controller is designed such that the temperature variation of the refresh period substantially matches the temperature variation of the memory cell leakage current. The maximum time between refreshes before data is lost is called the data retention time. The data retention time of a memory cell is affected predominantly by two leakage mechanisms: the subthreshold leakage of the pass transistor and the p-n junction leakage of the pass-transistor drain connecting to the storage capacitor. Both leakage currents increase exponentially with temperature. Therefore, an increase in temperature results in an exponential increase in leakage current, and a corresponding exponential decrease in data retention time.

The temperature-adaptive refresh controller causes the refresh period to exponentially decrease as the temperature increases. In one embodiment, the refresh period is set in response to the subthreshold current of a MOS transistor, which increases exponentially with temperature. More specifically, the subthreshold current of the MOS transistor is used to charge a capacitor element. When the capacitor element charges to a trip point voltage, the temperature-adaptive refresh controller initiates a refresh operation. The capacitor element is then discharged, and the process begins again. In this manner, the refresh period is determined by the subthreshold current of the MOS transistor.

The temperature-adaptive refresh controller thereby uses the exponential temperature relationship of the subthreshold current to empirically fit the data retention characteristics of the memory cells. The result is a memory device having a self-refresh operation automatically adjusted to compensate for the data retention variation with temperature. The resultant temperature-adaptive refresh controller optimizes the refresh power of the memory device with respect to temperature. Thus, the refresh period at room or lower temperatures is significantly greater (e.g., approximately 10 times greater) than the refresh period at high temperatures (100° C. or higher). Compared with a conventional self-refresh scheme, a significant power savings (about 10 times) is achieved for room temperature operation. Therefore, the present invention is particularly suitable for low power applications, which operate predominantly at room temperature or low temperatures.

The present invention will be more fully understood in view of the following description and drawings.

DETAILED DESCRIPTION OF THE INVENTION

In accordance with the present invention, an SRAM compatible device is designed using DRAM cells. This SRAM compatible device is hereinafter referred to as a one-transistor SRAM (1-T SRAM).

Figure 1:
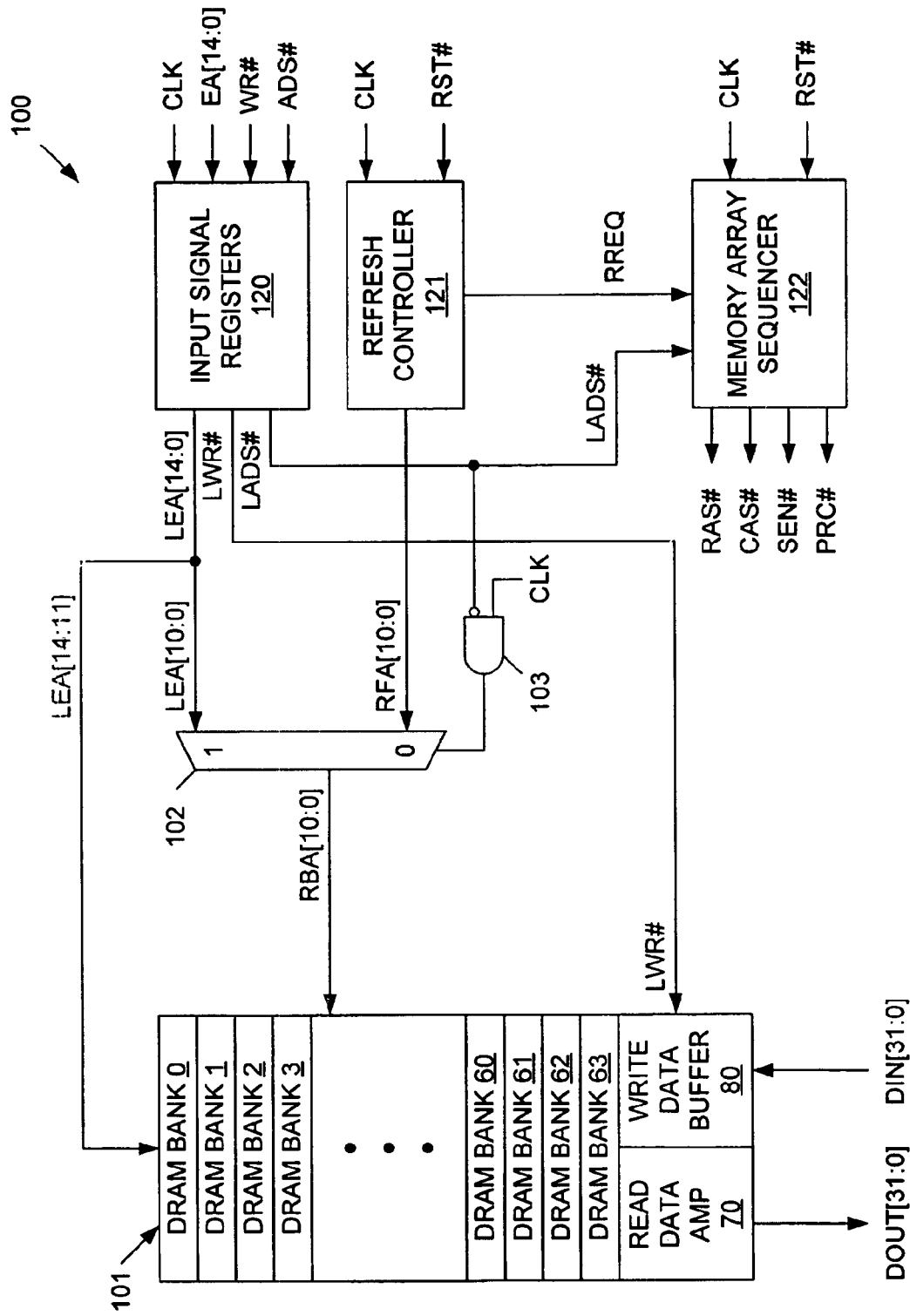
FIG. 1 is a block diagram of a memory system in accordance with one embodiment of the present invention.

FIG. 1 is a block diagram of a 1-T SRAM system 100 in accordance with one embodiment of the present invention. 1-T SRAM system 100 includes DRAM array 101, 2-to-1 multiplexer 102, AND gate 103, input signal registers 120, refresh controller 121 and memory array sequencer 122. DRAM array 101 includes 64 DRAM memory banks 0–63, read data amplifier 70 and write data buffer 80. Each of DRAM banks 0–63 includes 32 rows and 512 columns of DRAM memory cells, as well as the associated address decoders, word line drivers, sense-amplifiers and column multiplexers, which are not shown, but are understood by those of ordinary skill in the art. The column multiplexers of DRAM memory banks 0–63 are connected in parallel to read data amplifiers 70 and write data buffer 80. Each of DRAM banks 0–63 is capable of storing 512 32-bit words. The total capacity of DRAM memory banks 0–63 is therefore 32K 32-bit words.

The external interface of 1-T SRAM system includes a 32-bit input data bus for providing an input data word DIN[31:0] to write data buffer 80, a 32-bit output data bus for providing an output data word DOUT[31:0] from read data amplifier 70, a write/read indicator line for receiving write/read indicator signal WR#, a clock input terminal for receiving an external clock signal CLK, a 14-bit address bus for receiving external address bits EA[14:0], an address strobe line for receiving an address strobe signal ADS#, and a reset line for receiving a reset signal RST#. As used herein, the # symbol indicates that a signal is active low. Note that the signals listed above do not include any signals specifically relating to refresh accesses of DRAM banks 0–63.

All of the external signals are referenced to the rising edge of the CLK signal. The external address signal EA[14:0] is divided into 3 fields: a 4-bit word (column) address EA[14:11] (which identifies one of the sixteen 32 bit words in a row), a 6-bit bank address EA[10:5] (which identifies one of the 64 memory banks 0–63), and a 5-bit row address A[4:0] (which identifies one of the 32 rows in a memory bank).

An external device initiates an access to 1-T SRAM system 100 by asserting a logic low address strobe signal ADS#, driving the write/read indicator signal WR# to the desired state (high for write and low for read), and providing an external address EA[14:0]. The ADS#, WR# and EA[14:0] signals are all registered (i.e., latched) into input signal registers 120 at the rising edge of CLK signal. Input signal registers 120 provide the latched ADS#, WR# and EA[14:0] signals as latched output signals LADS#, LWR# and LEA[14:0], respectively. The latched external address LEA[14:0] is divided into two groups of address signals. Address signal LEA[14:11] contains the column address of the memory cells selected for the external access, and address signal LEA[10:0] contains the row and bank address of the memory cells selected for the external access. Address signal LEA[14:11] is provided to the column decoder circuitry in each of DRAM banks 0–63. Address signal LEA[10:0] is provided to an input bus of 2-to-1 multiplexer 102.

The latched address strobe signal LADS# is provided to memory array sequencer 122 and to an inverting input terminal of AND gate 103. The latched write/read indicator signal LWR# is provided to read data amplifier 70 and write data buffer 80.

Refresh accesses to DRAM array 101 are managed by refresh controller 121. Refresh controller 121 initiates a refresh access by activating a refresh request signal RREQ high in response to the external clock signal CLK. As described in more detail below, refresh controller 121 activates the refresh request signal RREQ high once every 64 clock periods. Refresh controller 121 also provides an 11 bit refresh address RFA[10:0], which identifies the bank and row to be refreshed in DRAM array 101. The refresh address RFA[10:0] is incremented each time the refresh request signal is activated.

Figure 2:
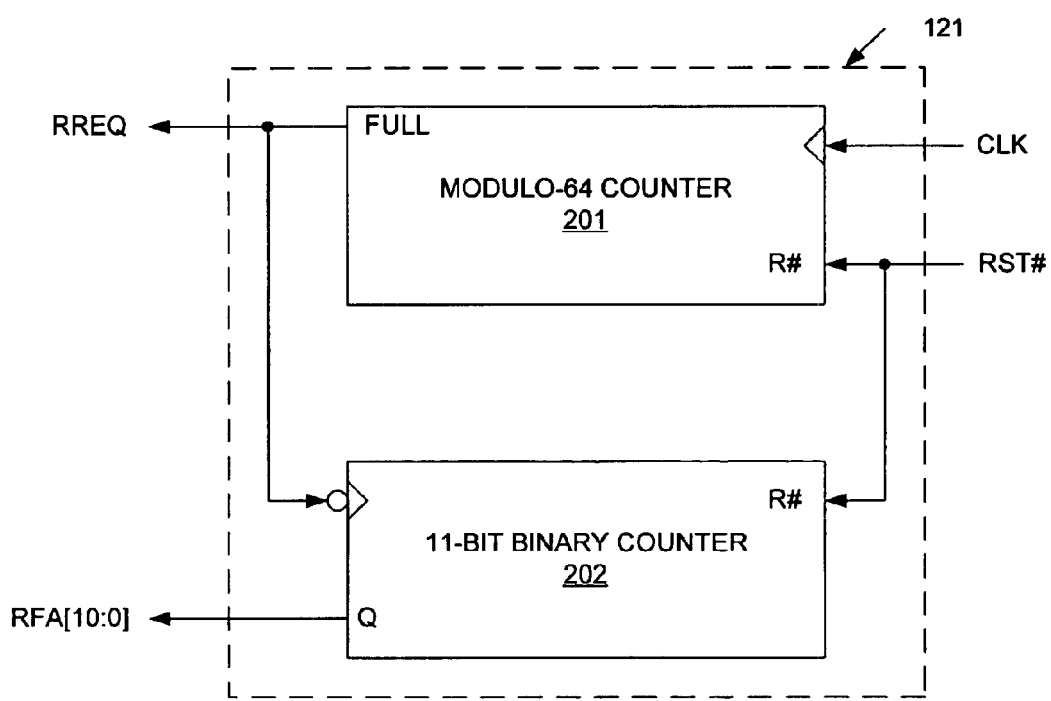
FIG. 2 is a block diagram of a refresh controller used in the memory system of FIG. 1 in accordance with one embodiment of the present invention.

FIG. 2 is a block diagram of refresh controller 121 in accordance with one embodiment of the present invention. Refresh controller 121 includes a modulo-64 counter 201 for generating the refresh request signal RREQ, and an 11-bit binary counter 202 for generating the bank and row address RFA[10:0] for the current refresh operation. Counters 201 and 202 are reset to zero counts when the reset signal RST# is activated low during the initialization of memory system 100. After the RST# signal is de-activated high, modulo-64 counter 201 begins counting from 0 to 63, with counter 201 being incremented by one in response to each rising edge of the external clock signal CLK. When modulo-64 counter 201 reaches a full count of 63, this counter 201 drives the refresh request signal RREQ high for one period of the CLK signal. Modulo-64 counter 201 then wraps around to a zero count in response to the next rising edge of the CLK signal.

The falling edge of the refresh request signal RREQ increments the count of 11-bit binary counter 202 by one. The output of 11-bit binary counter 202, provides the refresh address RFA[10:0], which identifies the bank and row to be refreshed in DRAM array 101. After 11-bit binary counter 202 reaches a full count of "111 1111 1111", the count will automatically wrap around to a zero count in response to the next rising edge of the refresh request signal RREQ. In this manner, refresh controller 121 provides a refresh address RFA[10:0] that traverses the entire row and bank address space of DRAM array 101.

Memory array sequencer 122 generates the conventional DRAM control signals RAS# (row access), SEN# (sense amplifier enable), CAS# (column access), and PRC# (precharge) for controlling the operations of memory array 101. The functionality of the RAS#, SEN#, CAS# and PRC# control signals in accessing a DRAM array is understood by those of ordinary skill in the art. For example, the functionality of these control signals is described in detail in U.S. Pat. No. 6,078,547, "Method and Structure for Controlling Operation of a DRAM Array", by Wingyu Leung, which is hereby incorporated by reference.

Figure 3:
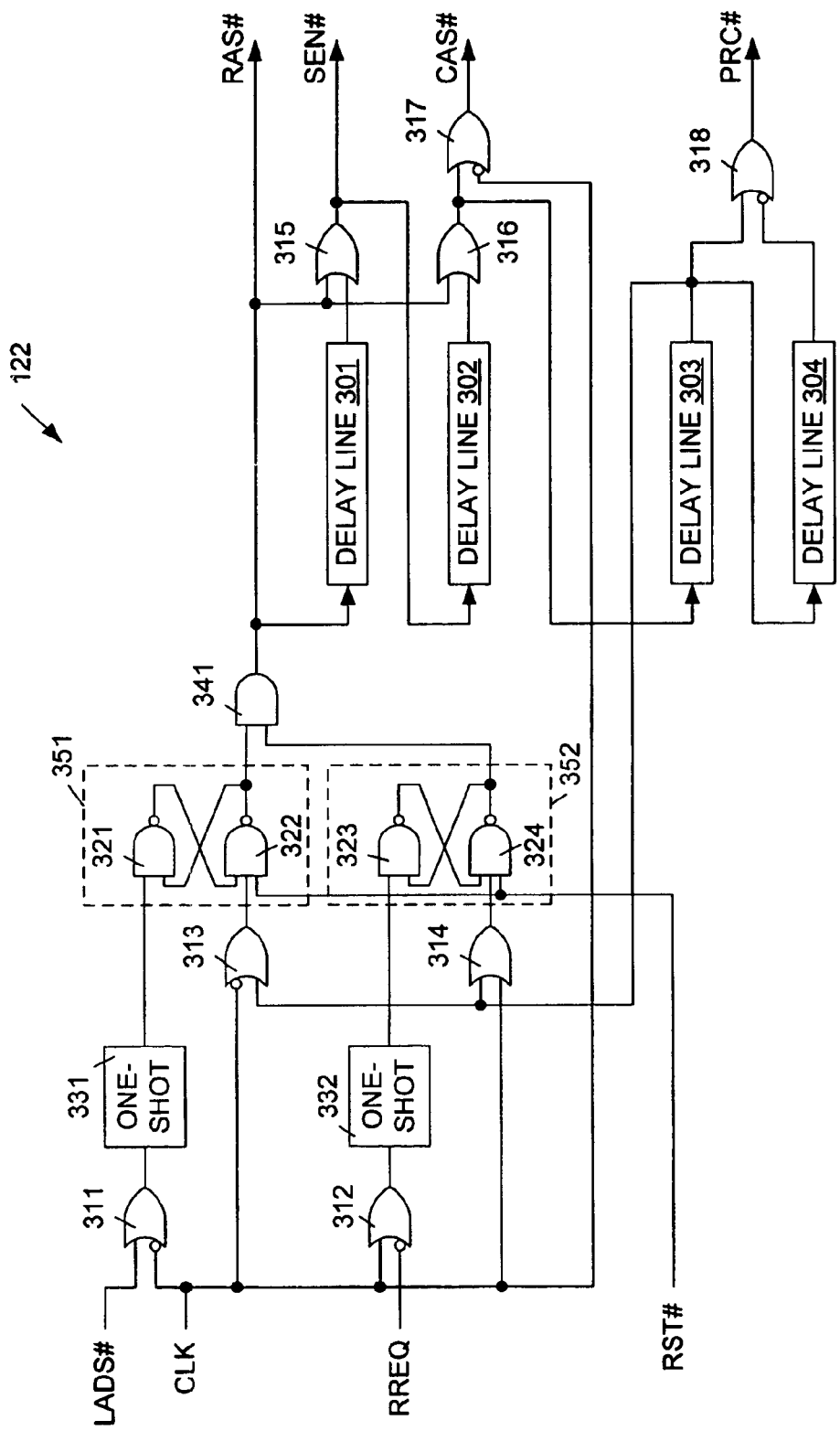
FIG. 3 is a circuit diagram of a memory array sequencer used in the memory system of FIG. 1 in accordance with one embodiment of the present invention.

FIG. 3 is a circuit diagram of memory array sequencer 122 in accordance with one embodiment of the present invention. Memory array sequencer 122 includes delay lines 301–304, OR gates 311–318, one-shot circuits 331–332, AND gate 341, and flip-flops 351–352. Flip-flop 351 includes cross-coupled NAND gates 321–322, and flip-flop 352 includes cross-coupled NAND gates 323–324. Delay lines 301, 302, 303 and 304 introduce signal delays d1, d2, d3, and d4, respectively. In general, memory array sequencer 122 activates the RAS#, SEN#, CAS# and PRC# signals at predetermined times during half of a CLK period. As a result, an external access (read or write) may be performed during one half of a CLK period, and a refresh access may be performed during the other half of the same CLK period. In the described embodiment, external accesses are performed during the half clock period that the CLK signal has a logic high state, and refresh accesses are performed during the half clock period that the CLK signal has a logic low state.

When 1-T SRAM system 100 is started, the RST# signal is activated low, thereby setting flip-flops 351 and 352, such that these flip-flops provide logic high output signals to AND gate 341. The RST# signal is then deactivated high, thereby allowing flip-flops 351 and 352 to operate in response to the other applied signals. When there is no external access to system 100, the latched address strobe signal LADS# is de-activated high. When there is not refresh access pending in system 100, the refresh request signal RREQ is de-activated low. Under these conditions, OR gates 311 and 312 provide logic high signals to one-shot circuits 331 and 332, respectively. In response, one-shot circuits 331–332 provide logic high signals to flip-flops 351–352, respectively, thereby causing flip-flops 351–352 to continue to provide logic high output signals to AND gate 341. The logic high output of AND gate 341 de-activates the RAS#, SEN#, CAS# and PRC# control signals high. At this time, memory array 101 is idle.

As described in more detail below, the latched address strobe signal LADS# is activated low during an external access. The low state of the LADS# signal, along with the high state of the CLK signal causes the output of OR gate 311 to go low. The falling edge at the output of OR gate 311 causes one-shot circuit 331 to generate a negative going pulse having a width substantially shorter than half of the CLK period. This negative pulse resets the output of flip-flop 351 to a logic low value. The logic low value provided by flip-flop 351 causes AND gate 341 to activate the RAS# signal low. The low state of the RAS# signal propagates through delay lines 301, 302, 303 and 304 (as well as OR gates 315–317) to drive signals SEN#, CAS# and PRC# low in sequence. More specifically, the low RAS# signal propagates through delay line 301 and OR gate 315 to activate the SEN# signal low after a delay of d1. The low SEN# signal then propagates through delay line 302 and OR gates 316–317 to activate the CAS# signal low after an additional delay of d2. Note that the logic high CLK signal applied to the inverting input terminal of OR gate 317 allows the logic low signal from OR gate 316 to be passed as the low CAS# signal. The low CAS# signal then propagates through delay line 303 to activate the PRC# signal low after an additional delay of d3.

The logic low signal provided by delay line 303 propagates through delay line 304 after an additional delay of d4. The logic low output of delay line 304 is provided to the inverting input terminal of OR gate 318. As a result, the PRC# signal is de-activated high a delay d4 after being activated low.

The low state of the output of delay line 303 and the high state of the CLK signal cause OR gate 313 to provide a logic low value to flip-flop 351, thereby setting the output of flip-flop 351 to a logic high state. In response, AND gate 341 deactivates the RAS# signal to a logic high state. The logic high RAS# signal is applied to OR gates 315 and 316, thereby causing the SEN# and CAS# signals, respectively, to be immediately de-activated high. The logic high value provided by OR gate 316 propagates through delay line 303 after a delay of d3, thereby causing OR gate 318 to continue to de-activate the PRC# signal high. The logic high value provided by delay line 303 propagates through delay line 304 after a delay of d4, and is applied to the inverting input terminal of OR gate 318. In this manner, the output signals provided by delay lines 301–304 are reset to their original logic high states, such that these delay lines are ready for the next access.

The total delay introduced by delay lines 301, 302, 303, and 304 is designed to be less than or equal to a half period of the CLK signal. Notice that the RAS# signal is recovered to a logic high state before the CLK signal transitions from the high state to a low state. As a result, another memory cycle can be started at the falling edge of the CLK signal. To ensure that the SEN# and CAS# signals are generated properly during back-to-back memory cycles, the outputs of delay lines 301 and 302 are required to be de-activated high before the RAS# signal is activated low again.

In the present embodiment, the delay d4 introduced by delay line 304 is longer than the delay d1 introduced by delay line 301 or the delay d2 introduced by delay line 302. As a result, when the PRC# signal is de-activated high, delay lines 301 and 302 are already providing logic high output signals. In other embodiments, delay line 301 or delay line 302 can have a longer delay than delay line 304. However, in such embodiments, a fast reset must be provided on delay lines 301 and 302, thereby ensuring that the output signals provided by delay lines 301 and 302 recover to logic high states before the activation period of the PRC# signal expires.

A memory refresh operation is performed when the refresh request signal RREQ is activated to a logic high value and the CLK signal has a logic low value. That is, refresh operations are only performed during the half period that the CLK signal has a logic low state. The high state of the RREQ signal and the low state of CLK signal causes OR gate 312 to provide a logic low output signal to one-shot circuit 332. In response, one-shot circuit 332 provides a negative going pulse having a pulse width substantially shorter than a half period of the CLK signal. The negative pulse resets the output of flip-flop 352 to a logic low state. This logic low output signal provided by flip-flop 352 is applied to an input terminal of AND gate 341. In response, AND gate 341 activates the RAS# signal low. The low state of RAS# signal propagates through delay line 301, thereby causing the SEN# signal to be activated low after delay d1.

The low state of the SEN# signal propagates through delay line 302 after delay d2, thereby causing OR gate 316 to provide a logic low output signal to OR gate 317. Because the inverting input terminal of OR gate 317 receives a logic low CLK signal at this time, the CAS# signal remains de-activated high. The CAS# signal is thereby suppressed during the refresh access (because the refresh access does not involve a column access).

The logic low signal provided by OR gate 316 propagates through delay line 303, thereby providing a low signal to the non-inverting input terminal of OR gate, and causing the PRC# signal to be activated low after delay d3. The logic low state of the output signal provided by delay line d3 propagates through delay line 304, thus providing a logic low signal to the inverting input terminal of OR gate 318 after delay d4. OR gate 318 de-activates the PRC# signal high in response to the logic low signal provided to the inverting input terminal of OR gate. The low state of the output signal provided by delay line 303 and the low state of the CLK signal cause OR gate 314 to provide a logic low output signal to flip-flop 352. In response, flip-flop 352 provides a logic high signal to AND gate 341, thereby causing AND gate 341 to deactivate the RAS# signal high. The high state of the RAS# signal causes OR gate 315 to provide a logic high output signal, thereby causing the SEN# signal to be deactivated high. The high state of the RAS# signal also causes OR gate 316 to provide a logic high output signal. After a delay of d3, the logic high output signal provided by OR gate 316 propagates through delay line 303, to the non-inverting input terminal of OR gate 318, thereby causing OR gate 318 to continue to de-activate the PRC# signal high. The logic high value provided by delay line 303 propagates through delay line 304 after a delay of d4, and is applied to the inverting input terminal of OR gate 318. In this manner, the output signals provided by delay lines 301–304 are reset to their original logic high states, such that these delay lines are ready for the next access.

Returning now to FIG. 1, multiplexer 102 routes either the latched external address LEA[10:0] or the refresh address RFA[10:0] to memory array 101 as the row/bank address RBA[10:0]. Multiplexer 102 is controlled by the output signal provided by AND gate 103. During an external access, the LADS# signal is activated low and the CLK signal is high, thereby causing AND gate 103 to provide a logic high signal to the control terminal of multiplexer 102. In response, multiplexer 102 routes the latched external address LEA[10:0] to array 101. If an external access is not being performed, AND gate 103 provides a logic low signal to the control terminal of multiplexer 102, thereby causing the refresh address RFA[10:0] to be routed to array 101.

Figure 4:
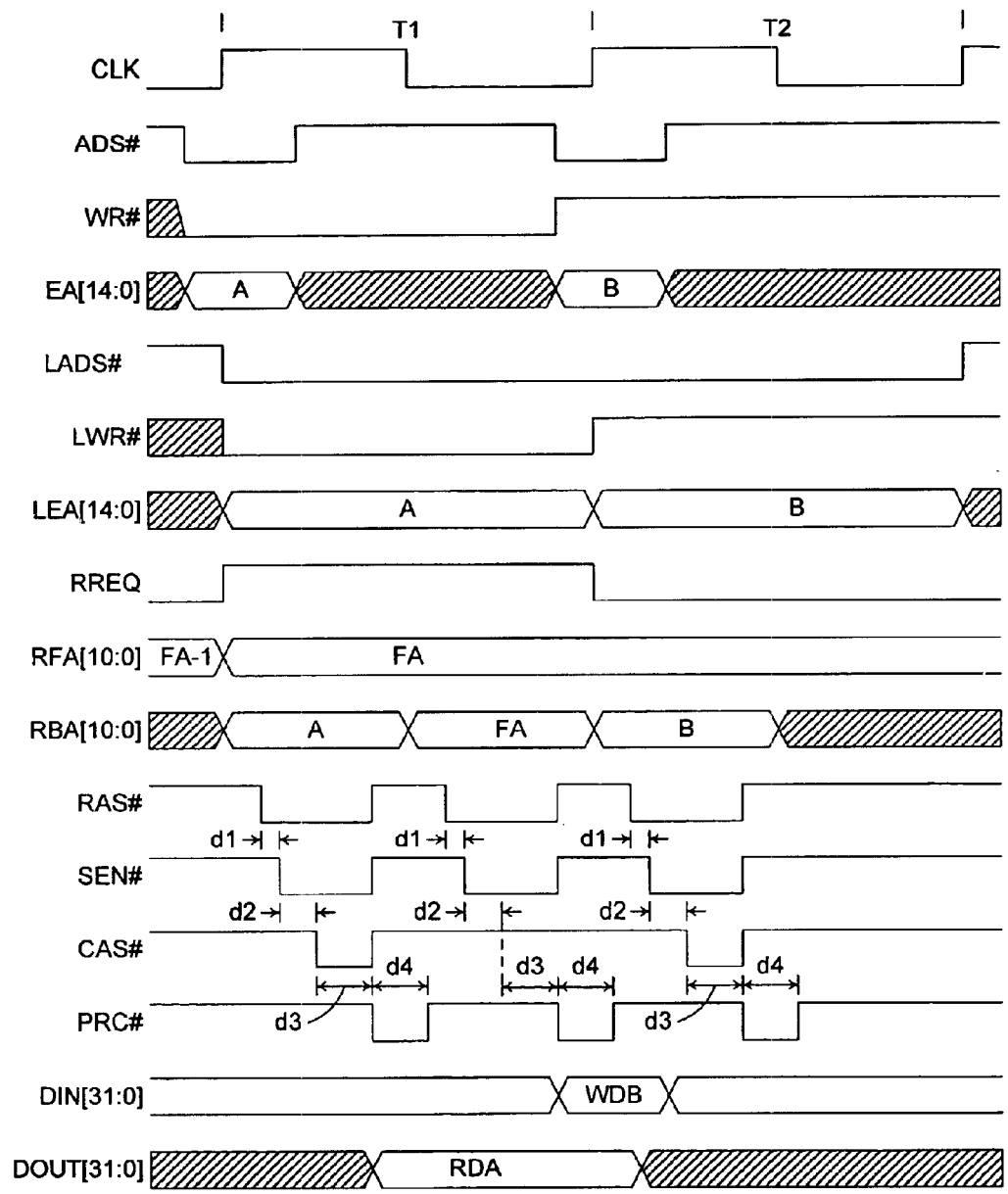
FIG. 4 is a waveform diagram illustrating the timing of various signals in the memory system of FIG. 1 in accordance with one embodiment of the present invention.

FIG. 4 is a waveform diagram that illustrates the timing of various signals in 1-T SRAM system 100 in accordance with one embodiment of the present invention. In the described example, a read access is performed during the first half of clock cycle T1. A refresh operation is performed during the second half of clock cycle T1. A write access is performed during the first half of clock cycle T2. Memory system 100 is idle during the second half of clock cycle T2, as there is no pending refresh at this time. To simplify the timing in the description below, all of the logic gates are assumed to have a negligible delay compared to the period the CLK signal and the delays d1–d4 introduced by delay lines 301–304.

Read Access

The external accessing client provides a low ADS# signal, a low WR# signal and an external address signal EA[14:0] before the rising edge of clock cycle T1. The low WR# signal specifies a read operation, and the external address signal EA[14:0] specifies the read address within DRAM array 101. At the rising clock-edge of cycle T1, the ADS#, WR# and EA[14:0] signals are latched into input signal registers 120, and provided as the LADS#, LWR# and LEA[14:0] signals, respectively.

Within refresh controller 121, the rising clock-edge of cycle T1 increments modulo-64 counter 201 to a full count thereby causing the refresh request signal RREQ to be activated high. The high state of the RREQ signal increments 11-bit binary counter by one count, such that the refresh address RFA[10:0] has a value represented by "FA". The refresh address FA identifies the bank and row address for the pending refresh operation. The refresh address FA is provided to multiplexer 102, as the refresh address signal RFA[10:0].

The logic low LADS# signal and the logic high CLK signal cause AND gate 103 (FIG. 1) to provide a logic high control signal to multiplexer 102. In response, multiplexer 102 routes the bank/row information of the latched address LEA[10:0] to memory array 101 as the RBA[10:0] signal. The column information of the latched address LEA[14:11] is also provided to memory array 101. In response, decoders (not shown) identify an addressed bank, an addressed row and an addressed set of columns of the present read access.

The logic low LADS# signal and the logic high RREQ are provided to memory array sequencer 122 (FIG. 3). The low state of the LADS# signal and the high state of the CLK signal causes the RAS# signal to be activated low in the manner described above. The low state of the RAS# signal propagates through delay line 301, thereby causing the SEN# signal to be activated low after a delay of d1. The low state of the SEN# signal propagates through delay line 302, thereby causing the CAS# signal to be activated low after a delay of d2. Finally, the low state of the CAS# signal propagates through delay line 303, thereby causing the PRC# signal to be activated low after a delay of d3. In this manner, the RAS#, SEN#, CAS# and PRC# signals are sequentially activated low.

The logic low RAS# signal causes the data in the addressed row of the addressed bank (as specified by LEA [10:0]) to be driven to the sense amplifiers of the addressed bank. The logic low SEN# signal causes this row of data to be latched in the sense amplifiers of the addressed bank. The logic low CAS# signal causes the sense amplifiers corresponding with the addressed set of columns (as specified by LEA[14:11]) to be coupled to read data amplifier 70. The logic low PRC# signal causes the data word (RDA) read from DRAM array 101 to be latched into read data amplifier 70 and provided as the data output signal DOUT[31:0].

Within memory array sequencer 122, the low state of the PRC# signal also causes the RAS#, SEN# and CAS# signals to be deactivated high in the manner described above. Within memory array 101, the low state of the PRC# signal turns off the word line of the addressed row in the addressed bank, turns off the sense amplifiers in the addressed bank, and precharges the bit lines of the addressed bank, thereby preparing memory array 101 for the next operation. After a delay of d4, the logic low output signal provided by delay line 303 propagates through delay line 304, thereby de-activating the PRC# signal high in the manner described above, and completing the read access.

Refresh Access

In the second half of clock cycle T1, the low state of the CLK signal causes AND gate 103 to provide a logic low signal to the control terminal of multiplexer 102. In response, multiplexer 102 routes the refresh address RFA [10:0] to memory array 101 as the RBA[10:0] signal. In response, decoders (not shown) identify an addressed bank and an addressed row of the present refresh access.

Within memory array sequencer 122, the low state of the CLK signal and the high state of the RREQ signal cause the RAS# signal to be activated low in the manner described above. The low state of the RAS# signal propagates through delay line 301, thereby causing the SEN# signal to be activated low after a delay of d1. The low state of the SEN# signal propagates through delay line 302, with a delay of d2, and then through delay line 303, with a delay of d3, thereby causing the PRC# signal to be activated low after a delay of d2 plus d3. Note that the logic low CLK signal prevents OR gate 317 from activating a logic low CAS# signal, as column access is not required during a refresh operation. In this manner, the RAS#, SEN# and PRC# signals are sequentially activated low.

The logic low RAS# signal causes the data in the addressed row of the addressed bank (as specified by RFA [10:0]) to be driven to the sense amplifiers of the addressed bank. The logic low SEN# signal causes this row of data to be latched in the sense amplifiers of the addressed bank. The sense amplifiers resolve the data values to a full signal swing, thereby refreshing the data from the addressed row.

Within memory array sequencer 122, the low state of the PRC# signal causes the RAS# and SEN# signals to be deactivated high in the manner described above. Within memory array 101, the low state of the PRC# signal turns off the word line of the addressed row in the addressed bank, turns off the sense amplifiers in the addressed bank, and precharges the bit lines of the addressed bank, thereby preparing DRAM array 101 for the next operation. After a delay of d4, the PRC# signal is deactivated high, thereby completing the refresh access.

Write Access

The external accessing client provides a low ADS# signal, a high WR# signal, a write data value DIN[31:0] and an external address signal EA[14:0] before the rising edge of clock cycle T2. The high WR# signal specifies a write operation, and the external address signal EA[14:0] specifies the write address within DRAM array 101. At the rising clock-edge of cycle T2, the ADS#, WR# and EA[14:0] signals are latched into input signal registers 120, and provided as the LADS#, LWR# and LEA[14:0] signals, respectively. In addition, the write data value DIN[31:0] is latched into write data buffer 80.

The logic low LADS# signal and the logic high CLK signal cause AND gate 103 (FIG. 1) to provide a logic high control signal to multiplexer 102. In response, multiplexer 102 routes the bank/row information of the latched address LEA[10:0] to DRAM array 101 as the RBA[10:0] signal. The column information of the latched address LEA[14:11] is also provided to memory array 101. In response, decoders (not shown) identify an addressed bank, an addressed row and an addressed set of columns of the present write access.

Within refresh controller 121, the modulo-64 counter 201 is incremented to a zero count in response to the rising edge of the CLK signal, thereby causing the refresh request signal RREQ to be deactivated low.

The logic low LADS# signal and the logic low RREQ signal are provided to memory array sequencer 122 (FIG. 3). The low state of the LADS# signal and the high state of the CLK signal cause the RAS#, SEN#, CAS# and PRC# signals to be sequentially activated low in the manner described above.

The logic low RAS# signal causes the data in the addressed row of the addressed bank (as specified by LEA

[10:0]) to be driven to the sense amplifiers of the addressed bank. The logic low SEN# signal causes this row of data to be latched in the sense amplifiers of the addressed bank. The logic low CAS# signal causes the sense amplifiers corresponding with the addressed set of columns (as specified by LEA[14:11]) to be coupled to write data buffer 80, thereby overwriting the data in the sense amplifiers corresponding with the addressed set of columns with the write data value DIN[31:0]. These sense amplifiers, in turn, couple the write data value to the corresponding memory cells in the addressed row.

Within memory array sequencer 122, the low state of the PRC# signal causes the RAS#, SEN# and CAS# signals to be deactivated high in the manner described above. Within DRAM array 101, the low state of the PRC# signal turns off the word line of the addressed row in the addressed bank, turns off the sense amplifiers in the addressed bank, and precharges the bit lines of the addressed bank, thereby preparing memory array 101 for the next operation. After a delay of d4, the PRC# signal is deactivated high, thereby completing the write access.

In the foregoing manner, 1-T SRAM system 100 implements refresh accesses without interfering with external accesses, and without requiring an external refresh indicator signal. In the embodiment described above, the RAS#, SEN#, CAS# and PRC# signals are only activated when an external access or refresh operation is being performed. This results in power savings in 1-T SRAM system 100.

Alternate Embodiment

In the embodiment described above, the external accesses are performed during one half of the clock period (i.e., when the CLK signal is high), and the refresh operations are performed during the other half of the clock period (i.e., when the CLK signal is low). Operation of 1T SRAM system 100 therefore depends on both the high period and the low period of the CLK signal. Consequently, the operation and performance of 1-T SRAM system 100 is affected by the duty-cycle of the external clock signal CLK. Because a refresh access does not involve a column access operation, the memory cycle time for a refresh access is shorter than the memory cycle time for an external access. Consequently, 1-T SRAM system 100 would be capable of operating at higher clock frequencies if the memory cycle time of refresh accesses is optimized. In general, the shortest possible clock period (i.e., the highest possible clock frequency) exists when the clock period is equal to memory cycle time of an external access plus the memory cycle time of a refresh access. It is therefore desirable to have a memory system that operates independent of the clock duty-cycle, such that the memory system can operate in response to the shortest possible clock period.

Figure 5:
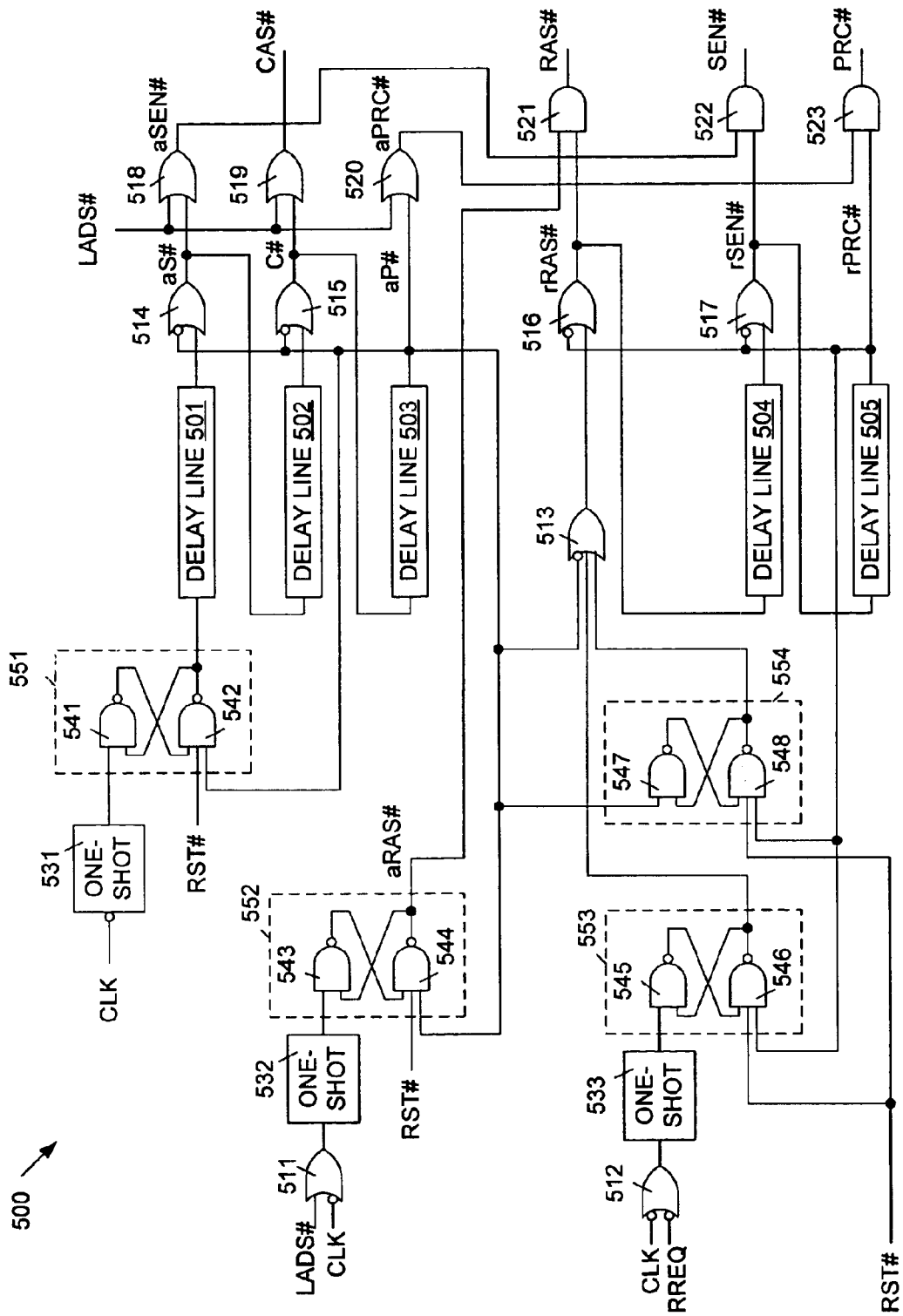
FIG. 5 is a circuit diagram of another memory array sequencer, which can be used to replace the memory array sequencer of FIG. 3 in another embodiment of the present invention.

FIG. 5 is a circuit diagram of memory array sequencer 500, which is used in another embodiment of the present invention. In this embodiment, memory array sequencer 500 replaces memory array sequencer 122 (FIGS. 1, 3). The construct of the other functional blocks of memory system 100 remains the same. As described in more detail below, memory array sequencer 500 enables memory system 100 to operate independent of the duty-cycle of the CLK signal.

Memory array sequencer 500 includes delay lines 501–505, OR gates 511–520, AND gates 521–523, one-shot circuits 531–533, and flip-flops 551–554, which include cross-coupled NAND gate pairs 541–542, 543–544, 545–546 and 547–548, respectively. In general, delay lines 501–503 introduce the same signal delays (d1, d2, d3) as delay lines 301–303, respectively. Delay lines 504 and 505 introduce the same delays (d1, d3) as delay lines 501 and 503, respectively. Delay lines 501–503 serve two functions. First, during an external (read/write) access, delay lines 501–503 generate the timing control for the memory access operations. That is, delay lines 501–503 control the timing of the SEN#, CAS# and PRC# signals during an external access cycle. Second, delay lines 501–503 control the timing of the beginning of a refresh period. Delay lines 504 and 505 generate the timing control for the refresh access operations. That is, delay lines 504–505 control the timing of the SEN# and PRC# signals during a memory refresh cycle. External access timing control signals aRAS#, aSEN#, aPRC# and their counterpart refresh timing control signals rRAS#, rSEN# and rPRC# are logically AND'ed to form the array control timing signals RASP, SEN# and PRC#, respectively. The CAS# signal, which controls the column operation of the array, is activated only during external access cycles.

Initial Generation of aRAS#, aSEN#, CAS#, aPRC#

Figure 6:
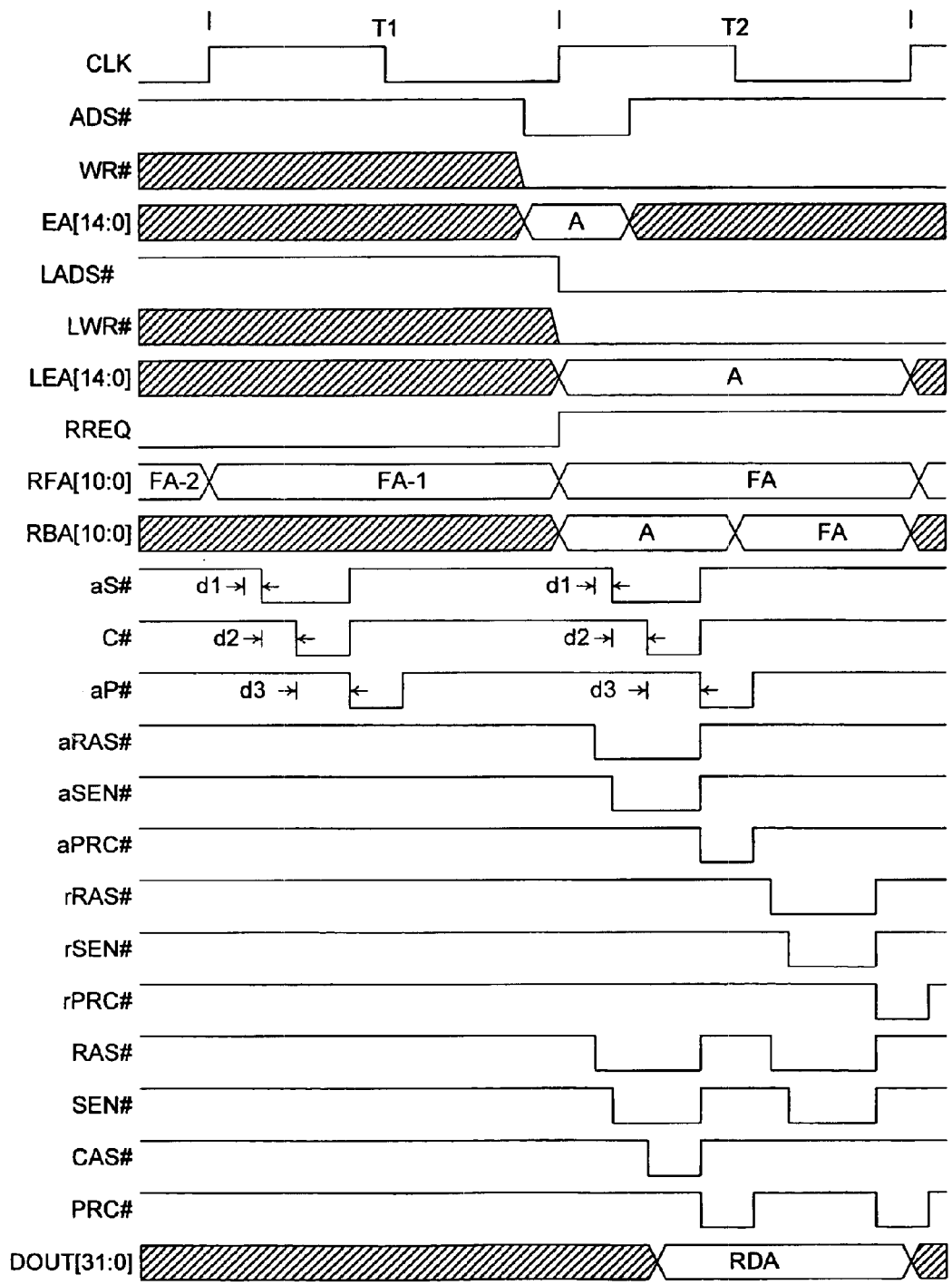
FIG. 6 is a waveform diagram illustrating the timing of various signals in the memory system of FIG. 1, when the memory array sequencer of FIG. 5 is used in place of the memory array sequencer of FIG. 3.

FIG. 6 is a waveform diagram illustrating the operation of 1-T SRAM system 100 when using memory array sequencer 500. During the first clock cycle T1, there are no external accesses or refresh accesses pending in the memory system. During the second clock cycle T2, both a read access and a refresh access are pending. Although a write access is not specifically described in FIG. 6, it is understood that memory array sequencer 500 generates the same signals during read and write accesses.

The first clock cycle T1 is representative of the state of memory array sequencer 500 after memory system 100 has been initialized (although it is understood that a refresh request would not be generated the cycle after initialization). When 1-T SRAM system 100 is started, the RST# signal is activated low, thereby setting flip-flops 551–554, such that these flip-flops provide logic high output signals. During clock cycle T1, there is no external access or refresh access to system 100, so the latched address strobe signal LADS# is de-activated high and the refresh request signal RREQ is de-activated low. As a result, OR gates 511 and 512 provide logic high signals to one-shot circuits 532 and 533, respectively. In response, one-shot circuits 532–533 provide logic high signals to flip-flops 552–553, respectively, thereby causing flip-flops 552–553 to continue to provide logic high output signals. The output signal of flip-flop 552 is referred to as the aRAS# signal. As described below, the aRAS# signal is used to activate the RAS# signal during an external access. The logic high aRAS# signal is provided to AND gate 521.

The logic high LADS# signal causes OR gates 518–520 to provide logic high output signals aSEN#, CAS# and aPRC#, respectively. The aSEN# and aPRC# signals are used to activate the SEN# and PRC# signals during an external access. The CAS# signal always corresponds with an external access (because the CAS# signal is not required during a refresh access). The logic high aSEN# and aPRC# signals are provided to AND gates 522 and 523, respectively.

Initial Generation of rRAS#, rSEN#, rPRC#

The logic high output signal of flip-flops 553 and 554 cause OR gate 513 to provide a logic high signal to OR gate 516. In response, OR gate 516 provides a logic high output signal. The output signal of OR gate 516 is referred to as the rRAS# signal. As described below, the rRAS# signal is used to activate the RAS# signal during a refresh access. The logic high rRAS# signal is provided to AND gate 521. Because both the aRAS# and rRAS# signals initially have logic high values, AND gate 521 initially provides a logic high (de-activated) RAS# signal.

The logic high rRAS# signal is routed through delay line 504 to OR gate 517, thereby causing OR gate 517 to provide a logic high rSEN# signal. The rSEN# signal is used to activate the SEN# signal during a refresh access. The logic high rSEN# signal is provided to AND gate 522. Because both the aSEN# and rSEN# signals initially have logic high values, AND gate 522 initially provides a logic high (de-activated) SEN# signal.

The logic high rSEN# signal is routed through delay line 505 to provide a logic high rPRC# signal. The rPRC# signal is used to activate the PRC# signal during a refresh access. The logic high rPRC# signal is provided to AND gate 523. Because both the aPRC# and rPRC# signals initially have logic high values, AND gate 523 initially provides a logic high (de-activated) PRC# signal.

Generation of aS#, C# and aP#

Initially, flip-flop 551 provides a logic high output signal to delay line 501. This logic high output signal propagates through delay line 501 to OR gate 514. In response, OR gate 514 provides a logic high aS# signal. As described below, the aS# signal is used to activate the aSEN# signal.

The logic high aS# signal propagates through delay line 501 to OR gate 515. In response, OR gate 515 provides a logic high C# signal. As described below, the C# signal is used to activate the CAS# signal.

The logic high C# signal propagates through delay line 503, thereby providing a logic high aP# signal. As described below, the aP# signal is used to activate the aPRC# signal, and to signal the start of a refresh access.

At the rising edge of each clock cycle, including clock cycle T1, one-shot circuit 531 is activated, such that one-shot circuit 531 generates a negative going pulse having a duration substantially shorter than one half the CLK period. This negative pulse resets the output of flip-flop 551 to a logic low value. The logic low value provided by flip-flop 551 propagates through delay line 501, with delay d1, to OR gate 514. In response, OR gate 514 provides a logic low aS# signal.

The logic low aS# signal propagates through delay line 502, with delay d2, to OR gate 515. In response, OR gate 515 provides a logic low C# signal.

The logic low C# signal propagates through delay line 503, with delay d3, thereby providing a logic low aP# signal. The logic low aP# signal causes the aS# and C# signals to transition to logic high states (through OR gates 514 and 515, respectively). The logic low aP# signal also returns (sets) the output of flip-flop 551 to a logic high state. The logic high C# signal propagates through delay line 503, with delay d3, thereby causing the aP# signal to transition back to a logic high state. Note that the aS#, C# and aP# signals are generated in this sequence during every cycle of the CLK signal, regardless of the states of the LADS# or RREQ signals. That is, the aS#, C# and aP# signals are generated in this sequence whether or not there is an external access and/or refresh access pending in memory system 100.

External Access

The external accessing client provides a low ADS# signal, a low WR# signal and an external address signal EA[14:0] before the rising edge of clock cycle T2. The low WR# signal specifies a read operation, and the external address signal EA[14:0] specifies the read address within array 101. At the rising clock-edge of cycle T2, the ADS#, WR# and EA[14:0] signals are latched into input signal registers 120, and provided as the LADS#, LWR# and LEA[14:0] signals, respectively. The functionality of the WR#, LWR#, EA[14:0] and LEA[14:0] signals has been described above in connection with FIGS. 1–4. Because these signals are not relevant to the operation of memory array sequencer 500, these signals are not discussed further in the present example.

Within refresh controller 121, the rising clock-edge of cycle T2 increments modulo-64 counter 201 to a full count thereby causing the refresh request signal RREQ to be activated high. The high state of the RREQ signal increments 11-bit binary counter by one count, such that the refresh address RFA[10:0] has a value represented by "FA". Because the functionality of the refresh address RFA[10:0] has been described above, this description is not repeated in the present example.

As described above, the LADS# signal is activated low at the rising edge of clock cycle T2. The low state of the LADS# signal, along with the high state of the CLK signal causes the output of OR gate 511 to go low. The falling edge at the output of OR gate 511 causes one-shot circuit 532 to generate a negative going pulse having a width substantially shorter than half of the CLK period. This negative pulse resets the output of flip-flop 552 (i.e., the aRAS# signal) to a logic low value. This logic low aRAS# signal causes AND gate 521 to activate the RAS# signal low.

The rising edge of clock cycle T2 also causes one-shot circuit 551 to generate a negative going pulse having a width substantially shorter than half of the CLK period. This negative pulse resets the output of flip-flop 551 to a logic low value. This logic low value propagates through delay lines 501, 502 and 503, thereby sequentially activating and deactivating the aS#, C# and aP# signals in the manner described above for clock cycle T1. Because the LADS# signal has a logic low value at this time, OR gates 518, 519 and 520 effectively pass the aS#, C# and aP# signals as the aSEN#, CAS# and aPRC# signals, respectively. In addition, AND gates 522 and 523 effectively pass the aSEN# and aPRC# signals as the SEN# and PRC# signals, respectively. When the aP# signal is activated low, flip-flop 552 is set, thereby de-activating the aRAS# signal high. In response, to the high aRAS# signal, AND gate 522 deactivates the RAS# signal high. The read access is performed in response to the sequentially activated and deactivated RAS#, SEN#, CAS# and PRC# signals. As described in more detail below, the aP# signal is used to coordinate the timing of the refresh access.

Refresh Access

Turning now to the refresh access, the rising edge of clock cycle T2 (along with the logic high RREQ signal) causes OR gate 512 to provide a logic low signal to one-shot circuit 533. In response, one-shot circuit 553 generates a negative going pulse having a width substantially shorter than half of the CLK period. This negative pulse resets the output of flip-flop 553 to a logic low value, which is provided to OR gate 513. However, because flip-flop 554 provides a logic high signal to OR gate 513, this OR gate continues to provide a logic high output signal. As a result, the rRAS# signal remains deactivated high.

The aP# signal is applied to an input terminal of flip-flop 554. When the aP# signal is activated low, flip-flop 554 is reset, thereby causing this flip-flop 554 to provide a logic low output signal to OR gate 513. However, because an inverting input terminal of OR gate 513 is coupled to receive the aP# signal, OR gate 513 continues to provide a logic high output signal at this time. As a result, the rRAS# signal remains deactivated high.

As described above, the aP# signal is deactivated high after a delay of d3. However, this transition of the aP# signal does not change the output signal of flip-flop 554. As a result, OR gate 513 provides a logic low output signal in response to the rising edge of the aP# signal. The logic low output signal of OR gate 513 is provided to OR gate 516. In response, OR gate 516 activates the rRAS# signal low. This logic low rRAS# signal is effectively routed through AND gate 521, thereby providing a logic low RAS# signal for the refresh access. In this manner, the RAS# signal of the refresh access is activated in response to the deactivated aP# signal. Stated another way, the refresh access is automatically initiated at the conclusion of the external (read) access. This advantageously allows the external access and the refresh access to be implemented in the shortest possible time.

The logic low rRAS# signal propagates through delay line 504 (with delay d2) to OR gate 517. In response, OR gate 517 activates the rSEN# signal low. This logic low rSEN# signal is effectively routed through AND gate 522, thereby providing a logic low SEN# signal for the refresh access.

The logic low rSEN# signal propagates through delay line 505 (with delay d3), thereby activating the rPRC# signal low. This logic low rPRC# signal is effectively routed through AND gate 523, thereby providing a logic low PRC# signal for the refresh access.

The logic low rPRC# signal causes the rRAS# and rSEN# signals to be deactivated high (through OR gates 516 and 517, respectively). The logic low rPRC# signal is also applied to input terminals of flip-flops 553 and 554, thereby setting the output signals of these flip-flops to logic high values, and preparing these flip-flops for the next refresh access. The logic high deactivated rSEN# propagates through delay line 505, thereby deactivating the rPRC# signal high after delay d2. At this time, memory array sequencer 500 has been returned to its initial state, and is ready for the next clock cycle.

Notice that if a refresh access were not pending in clock cycle T2, the RREQ signal would not be activated high. As a result, one-shot 533 would not be activated, and flip-flop 533 would continue to provide a logic high output signal to OR gate 513. Under these conditions, the rRAS#, rSEN# and rPRC# signals would not be activated low during this cycle, and the RAS#, SEN# and PRC# would not be activated for a second time during this cycle. That is, a refresh access will not be performed if a refresh access is not pending.

Second Alternate Embodiment

In the embodiments described above, a memory clock cycle is split into two portions, such that both a memory access operation and a refresh operation can be performed during a single memory clock cycle. As a result, the minimum memory clock period is limited to a memory access operation period plus a refresh operation period. Even when the refresh cycle is shorter than the memory access cycle, the amount of memory bandwidth allocated for refresh is substantial. In practical applications, refresh operations are relatively infrequent events, occurring once in multiple clock cycles. Allocating a fixed portion of each clock period in order to hide refresh operations wastes bandwidth. In accordance with another embodiment of the present invention, another way to decrease the impact of refresh operations on the operating frequency of the memory system is to allocate one refresh period among multiple clock cycles.

Figure 7:
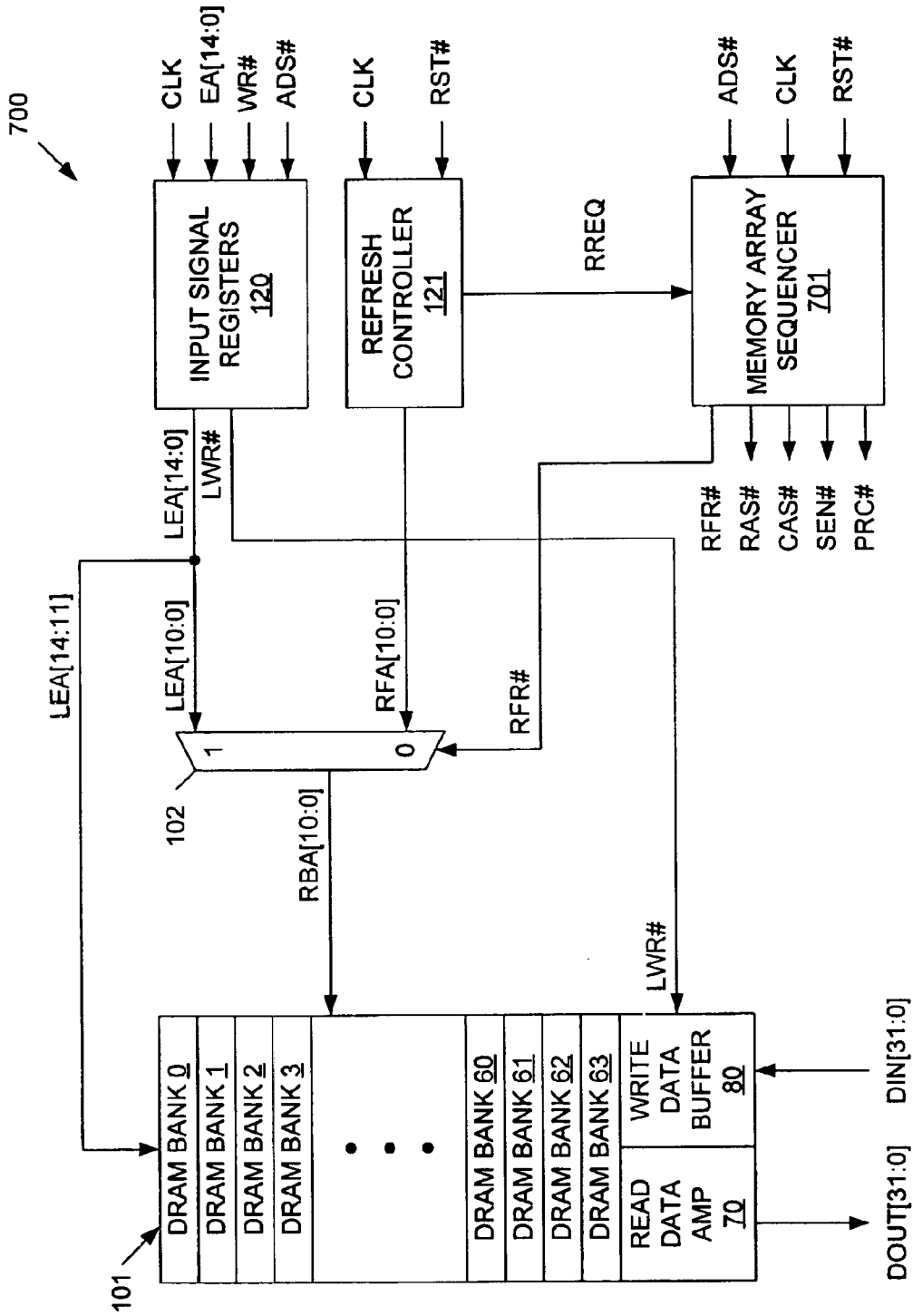
FIG. 7 is a block diagram of a 1-T SRAM system in accordance with another embodiment of the present invention.

FIG. 7 is a block diagram of a 1-T SRAM system 700, which is used in the present embodiment of the invention. Similar elements in memory system 100 (FIG. 1) and memory system 700 (FIG. 7) are labeled with similar reference numbers. Thus, 1-T SRAM system 700 includes DRAM array 101, 2-to-1 multiplexer 102, input signal registers 120 and refresh controller 121. 1-T SRAM system 700 also includes memory array sequencer 701, which replaces memory array sequencer 122 (FIGS. 1, 3).

In memory system 700, multiplexer 102 is controlled by a refresh control signal RFR#, which is generated by memory array sequencer 701. The generation of the RFR# signal is described in more detail below. When the RFR# signal is asserted low, multiplexer 102 routes the refresh address RFA[10:0] to the memory row address bus RBA [10:0] for a refresh operation. Conversely, when the RFR# signal is de-asserted high, multiplexer 102 routes the latched external address signal LEA[10:0] to the memory row address bus RBA[10:0] for a memory access. The operation of memory system 700 is similar to the operation of memory system 100, with the differences in the memory array operations described below.

First, an embodiment supporting one refresh cycle and two memory cycles in two clock cycles will be described. Then, an embodiment supporting one refresh cycle and three memory cycles in three clock cycles will be described. Based on the description of these two embodiments, the present invention can be extended to other embodiments, in which a refresh cycle can be carried out in a period of four or more clock cycles without interfering with access to the memory array 101.

Figure 8:
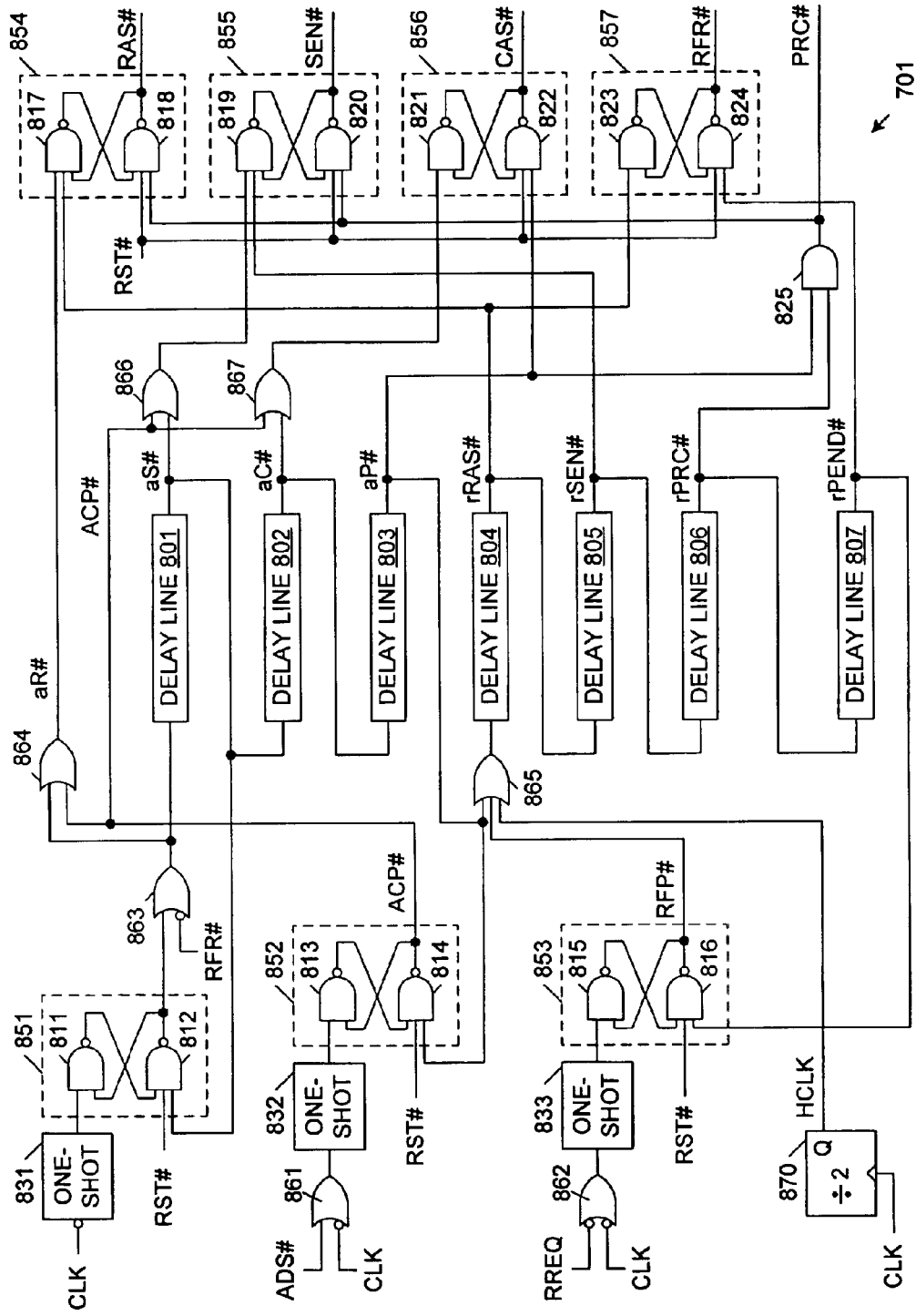
FIG. 8 is a circuit diagram of memory array sequencer used in the 1-T SRAM system of FIG. 7 in accordance with one embodiment of the invention, to support one refresh operation every two clock cycles.

FIG. 8 is a circuit diagram of memory array sequencer 701 in accordance with one embodiment of the invention, which supports one refresh operation and two memory access operations in two clock cycles. Memory array sequencer 701 includes delay lines 801–807, NAND gates 811–824, which are cross coupled as illustrated to form R-S flip-flops 851–857, AND gate 825, one-shot circuits 831–833, OR gates 861–867 and divide-by-two counter 870.

In general, one-shot circuits 831–833 operate in a manner similar to one-shot circuits 531–533 of memory array sequencer 500 (FIG. 5). Flip-flops 851–853 operate in a manner similar to flip-flops 551–553, respectively, of memory array sequencer 500 (FIG. 5). Flip-flops 854–856 are used to generate the memory access control signals RAS#, SEN# and CAS#, respectively. Flip-flop 857 is used to generate the refresh control signal RFR#, which is used to control multiplexer 102 (FIG. 7).

Refresh control signal RFR# stays low during a memory refresh cycle. In general, delay lines 801–803 introduce the same signal delays (d1, d2, d3) as delay lines 301–303, respectively. That is, delay lines 801–803 control the timing of the SEN#, CAS# and PRC# signals during an external access cycle. Delay lines 804–807 control the timing of the SEN#, CAS# and PRC# signals during a memory refresh cycle. Divide-by-two counter 870 divides the external clock signal CLK, thereby providing a half-clock signal HCLK having a frequency that is half the frequency of the CLK signal. As described in more detail below, the HCLK signal is used to enable one refresh cycle to be implemented every two clock cycles in accordance with the present embodiment.

Memory array sequencer 701 generates the memory control signals RAS#, SEN#, CAS#, PRC# and RFR# for memory access and refresh operations. The timing is generated such that only one refresh operation is allowed for every two clock cycles. The HCLK signal is used to define two different cycle types of the CLK signal. One clock cycle type is defined during the time that counter 870 provides a logic low HCLK signal. During these clock cycles, a refresh cycle is allowed. The other clock cycle type is defined during the time that counter 870 provides a logic high HCLK signal. During these clock cycles, no refresh cycle is allowed.

The refresh request signal RREQ provided by refresh controller 121 is sampled by the rising edge of the CLK signal. If the refresh request signal RREQ is high during a rising edge of the CLK signal, then OR gate 862 drives a logic low output signal, resulting in a negative pulse at the output of one-shot circuit 833. This negative pulse resets the output of flip-flop 853 to a logic '0' value, thereby activating the refresh pending signal RFP#. If the HCLK signal is also low, then delay lines 804–807 are enabled to generate the memory control timing for a memory refresh operation.

External memory accesses, however, can be launched every cycle of the CLK signal. At the rising-edge of the CLK signal, if the ADS# signal asserted low, then OR gate 861 provides a low output signal. This low output signal causes a low-going pulse to occur at the output terminal of one-shot circuit 832. This low-going pulse resets the output of flip-flop 852 to a logic '0' value, thereby activating the access pending signal ACP# low. Also at the rising-edge of the CLK signal, one-shot circuit 831 generates a low-going pulse that sets the output of flip-flop 851 a logic low value. In the absence of a refresh operation, the refresh control signal RFR# has a logic high value. In this case, the logic low state at the output of one-shot circuit 831, together with the logic high state of the RFR# signal causes OR gate 863 to provide a logic low output signal. The logic low output signal provided by OR gate 863, together with the logic low state of the access pending signal ACP# causes OR gate 864 to provide a logic low aR# signal. This logic low aR# signal resets flip-flop 854, thereby causing flip-flop 854 to assert a logic low RAS# signal. The falling edge of the RAS# signal identifies the beginning of a memory cycle. In this case, the memory cycle is a memory access (rather than a refresh access).

By design, both the memory access cycle time and the refresh cycle time are shorter than one period of the CLK signal (and the time required for two memory access cycles and one refresh cycle is shorter than two periods of the CLK signal). However, a memory access together with a refresh access is longer than one clock cycle. In the described embodiment, memory access operations are positioned at the beginning of a clock cycle, and refresh operations are positioned at the end of a clock cycle. As a result, a refresh operation initiated during one clock cycle is not completed until some time during the next clock cycle. Therefore, a memory access cycle following a refresh cycle is delayed. The delay is facilitated by the low state of the refresh control signal RFR#, which keeps the output of OR gate 864 high and inhibits the launch of the access cycle following the refresh cycle.

In the absence of an external access and a refresh operation, flip-flop 851 provides a logic low output signal to OR gate 863 at the rising edge of the CLK signal, thereby causing OR gate 863 to provide a logic low output signal to delay line 801. This logic low signal propagates to the output of delay line 801 as access control signal aS#, and then to the output of delay line 802 as access control signal aC#, and then to the output of delay line 803 as access control signal aP#. If there is a pending refresh (i.e., the RFP# signal is asserted low) and the HCLK signal is low, then the logic low aP# signal further propagates through delay lines 804, 805, 806 and 807, causing the refresh control signals rRAS#, rSEN#, rPRC#, and RPND#, respectively, to be sequentially asserted low. In the case where the refresh pending signal RFP# is high (i.e., no refresh is pending), or the HCLK signal is high, then the low aP# signal is not propagated to delay line 804 and the outputs of delay lines 804 to 807 remain at logic high states.

Returning now to the top of the delay chain, the logic low aS# signal sets the output of flip-flop 851 high, and this high signal in turn propagates to the outputs of delay lines 801–803 (and delay lines 804–807 if the RFP# and HCLK signals are low). Because flip-flop 851 is reset to provide a logic low output signal in response to each rising edge of the CLK signal, the aS#, aC# and aP# signals are pulsed low in response to every rising edge of the CLK signal. As long as there is no refresh cycle being performed, the logic low aS#, aC# and aP# pulses will have a first phase relationship relative to the rising edge of the CLK signal. However, if a refresh cycle is carried out, then the phases of the logic low aS#, aC# and aP# pulses are delayed accordingly by the low state of the RFR# signal. In the present embodiment, this delay is limited such that the back-to-back cycles of access-refresh-access operations are completed in two clock cycles.

The memory control signals RAS#, SEN#, CAS#, RFR#, and PRC# are predominantly derived from the falling edges of the signals at the output terminals of delay lines 801–807. Accordingly, during an access cycle when the access pending signal ACP# is asserted low, the RAS# signal is activated in response to the low state of the aR# signal at the output of OR gate 864; the SEN# signal is activated in response to the falling edge of the aS# signal; and the PRC# signal is activated in response to the low state of the aP# signal. The RAS#, SEN#, and CAS# signals are deactivated high in response to the falling edge of the PRC# signal.

Similarly, during a refresh cycle when the refresh pending signal RFP# is asserted low, both the refresh control signal RFR# and the RAS# signal are activated in response to the falling edge of the rRAS# signal; the SEN# signal is activated in response to the falling edge of the rSEN# signal; and the PRC# signal is activated in response to the low state of the rPRC# signal. The CAS# signal is not activated during a refresh cycle. Both the RAS# and SEN# signals are deactivated high by the falling edge of the PRC# signal. The refresh control signal RFR# is deactivated high at the end of a refresh cycle in response to the falling edge of refresh precharge end signal rPEND#, which is provided by delay line 807 in response to the rPRC# signal.

If there is no pending memory access, the access pending signal ACP# is deactivated high, and OR gates 864, 866 and 867 inhibit the activation of the RAS#, SEN# and CAS# signals, respectively. The PRC# signal, however, is still activated by the low going pulse aP#. This does not cause any functional problem in the memory as the default state of memory array 101 is the precharge state.

If there is no pending refresh access, the high state of the refresh pending signal RFP# inhibits the activation of the rRAS#, rSEN#, rPRC# and rPEND# signals at the output terminals of delay lines 804–807 and thus the activation of the memory control signals RAS#, SEN# and PRC#.

Figure 9:
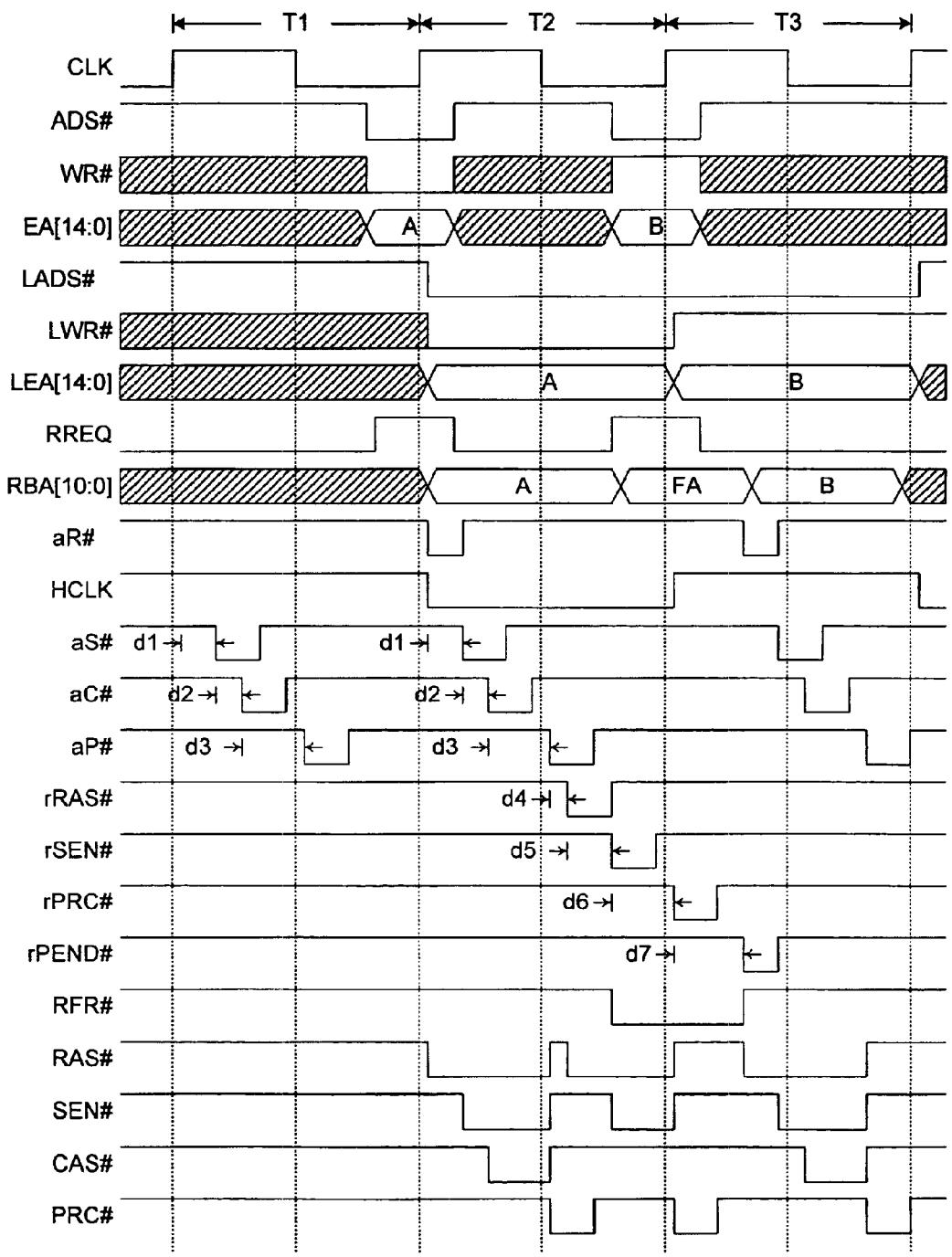
FIG. 9 is a waveform diagram illustrating the operation of the 1-T SRAM system of FIG. 7, when using the memory array sequencer of FIG. 8.

FIG. 9 is a waveform diagram illustrating the operation of 1-T SRAM system 700 when using memory array sequencer 701. During the first clock cycle T1, (i.e., an idle cycle) there are no external accesses or refresh accesses pending in the memory system. During the second clock cycle T2, both a read memory access and a refresh access are pending. During the third clock cycle T3, a write memory access and another refresh access are pending. As described below, the refresh access pending during the third clock cycle T3 is not processed during the third clock cycle T3. Note that it is not necessary for the memory access of cycle T2 to be a read access and the memory access of cycle T3 to be a write access. The memory accesses performed during cycles T2 and T3 can include any combination of read and/or write accesses in other examples.

As shown in FIG. 9, at the beginning of cycle T1, the high state of the address strobe signal ADS# is deactivated high, thereby indicating no external access is requested. The low state of the refresh request signal RREQ indicates that no refresh operation is requested. The high ADS# signal causes flip-flop 852 to deactivate the access pending signal ACP# high. Similarly, the low RREQ signal causes flip-flop 853 to deactivate the refresh pending signal RFP# signal high. As a result, no memory operation is carried out in this clock cycle. This is reflected by the high state of the memory control signals RAS#, SEN#, CAS#, and PRC# throughout cycle T1.

Note that the rising edge of the CLK signal at the beginning of cycle T1 causes flip-flop 851 to provide a logic low output signal to OR gate 863, thereby causing OR gate 863 to provide a logic low output signal, which is propagated through delay lines 801–803. As a result, the signals aS#, aC# and aP# are sequentially asserted and de-asserted during clock cycle T1. However, the logic high ACP# and RFP# signals ensure that these asserted aS#, aC# and aP# signals do not cause the RAS#, SEN#, CAS#, and PRC# signals to be asserted during cycle T1.

Prior to the rising edge of cycle T2, the ADS# signal is activated low, the write/read control signal WR# is driven low, and an external address EA[14:0] having a value of "A" is provided, thereby indicating that a read memory access to address "A" is pending. Also prior to the rising edge of cycle T2, the RREQ signal is activated high, thereby indicating that a refresh access is also pending.

At the rising edge of cycle T2, the low state of the ADS# signal causes the access pending signal ACP# to be activated low. In addition, the high state of the RREQ signal causes the refresh pending signal RFP# to be activated low. Moreover, the rising edge of the CLK signal causes OR gate 863 to provide a logic low output signal. OR gate 864 activates the aR# signal low in response to the logic low output of OR gate 863 and the logic low ACP# signal. This logic low aR# signal causes flip-flop 854 to assert the RAS# signal low.

The logic low output signal provided by OR gate 863 is also propagated through delay lines 801, 802 and 803, as access control signals aS#, aC# and aP#, respectively, with delays d1, d2 and d3, respectively. The logic low aS# and ACP# signals cause OR gate 866 to provide a logic low signal to flip-flop 855. In response, flip-flop 855 activates the SEN# signal low. The logic low aC# and ACP# signals cause OR gate 867 to provide a logic low signal to flip-flop 856. In response, flip-flop 856 activates the CAS# signal low. The logic low aP# signal causes AND gate 825 to activate the PRC# signal low. In this manner, the RAS#, SEN#, CAS# and PRC# signals are activated by the falling edges of the aR#, aS#, aC#, and aP# signals, respectively. The logic low PRC# signal causes flip-flops 854–856 to deactivate the RAS#, SEN#, and CAS# signals high. The PRC# is deactivated high when the aP# signal is deactivated high. In this manner, the first memory access is performed during clock cycle T2.

Because both the refresh pending signal RFP# and the half clock signal HCLK are low, the low-going pulse of the aP# signal is propagated through OR gate 865 to delay lines 804–807 as the rRAS#, rSEN#, rPRC#, and rPEND# signals. The activation of the rRAS# signal indicates the end of the memory access cycle and the beginning of the memory refresh cycle. The activated (low) rRAS# signal causes flip-flops 854 and 857 to activate the respective RAS# and RFR# signals low. The logic low refresh control signal RFR# causes the current refresh address (i.e., "FA") to be provided to the memory array. The activated (low) rSEN# signal causes flip-flop 855 to activate the SEN# signal low. Similarly, the activated (low) rPRC# signal causes AND gate 825 to activate the PRC# signal low. The activated (low) PRC# signal indicates the beginning of sense-amplifier precharge. Thus, the activated PRC# signal causes flip-flops 854 and 855 to deactivate the RAS# and SEN# signals high. The rPEND# signal is activated low after the low rPRC# signal propagates through delay line 807. The low rPEND# signal identifies the end of the refresh cycle, and causes flip-flop 857 to deactivate the refresh control signal RFR# high, thereby causing the latched external address (i.e., "B") to be provided to the memory array. The low rPEND# signal also resets the refresh pending signal RFP# provided by flip-flop 853. In this manner, a refresh access is performed, beginning in cycle T2 and ending in cycle T3.

Prior to the rising edge of cycle T3, the address strobe signal ADS# is activated low, the write/read control signal WR# is driven high, and the external address signal EA[14:0] has a value of B, thereby indicating a pending write operation. Also prior to the rising edge of cycle T3, the refresh request signal RREQ is activated high, thereby indicating another pending refresh request. (It is understood that the refresh request signal RREQ would not be asserted during consecutive clock cycles. However, the refresh request signal RREQ is activated high prior to cycle T3 in the present example to illustrate the manner in which the refresh request signal RREQ is processed when the HCLK signal has a logic high value.) The low state of the ADS# signal causes the access pending signal ACP# to be activated low, and the high state of the RREQ signal causes the refresh pending signal RFP# to be activated low. However, because the refresh cycle that began in cycle T2 is not finished by the beginning of cycle T3 (i.e., the RFR# signal is activated low at the rising edge of cycle T3), OR gate 863 provides a logic high output signal, which prevents OR gate 864 from activating the aR# signal low. Thus, the aR# signal remains deactivated in a logic high state and the new access cycle does not begin at the rising edge of cycle T3.

The refresh control signal RFR# is deactivated high about a quarter of the way through clock cycle T3 (in response to the activated rPEND# signal). At this time, OR gate 863 provides a logic low output signal, thereby enabling OR gate 864 to activate the aR# signal low. The logic low output signal provided by OR gate 863 also causes the sequential activation and deactivation of the aS#, aC# and aP# signals, in the manner described above. Accordingly, the RAS#, SEN#, CAS#, and PRC# signals are activated to carry out the memory access cycle. The access cycle ends with the deactivation of the RAS#, SEN#, CAS#, and PRC# signals. Note that this memory access cycle ends prior to the rising edge of the next clock cycle T4. As a result, two memory accesses and a refresh access are performed during two clock cycles T2 and T3. Also note that if the refresh access was not present during cycle T2, then the second memory access would be initiated immediately at the rising edge of clock cycle T3.

Moreover, although the refresh pending signal RFP# is activated low, the HCLK signal provided by counter 870 is deactivated high, thereby preventing OR gate 865 from propagating the aP# signal to delay line 804. As a result, the refresh control signals rRAS#, rSEN#, rPRC# and rPEND# are not activated during cycle T3. The pending refresh operation is served in the following clock cycle, when the HCLK signal is activated low.

Figure 10:
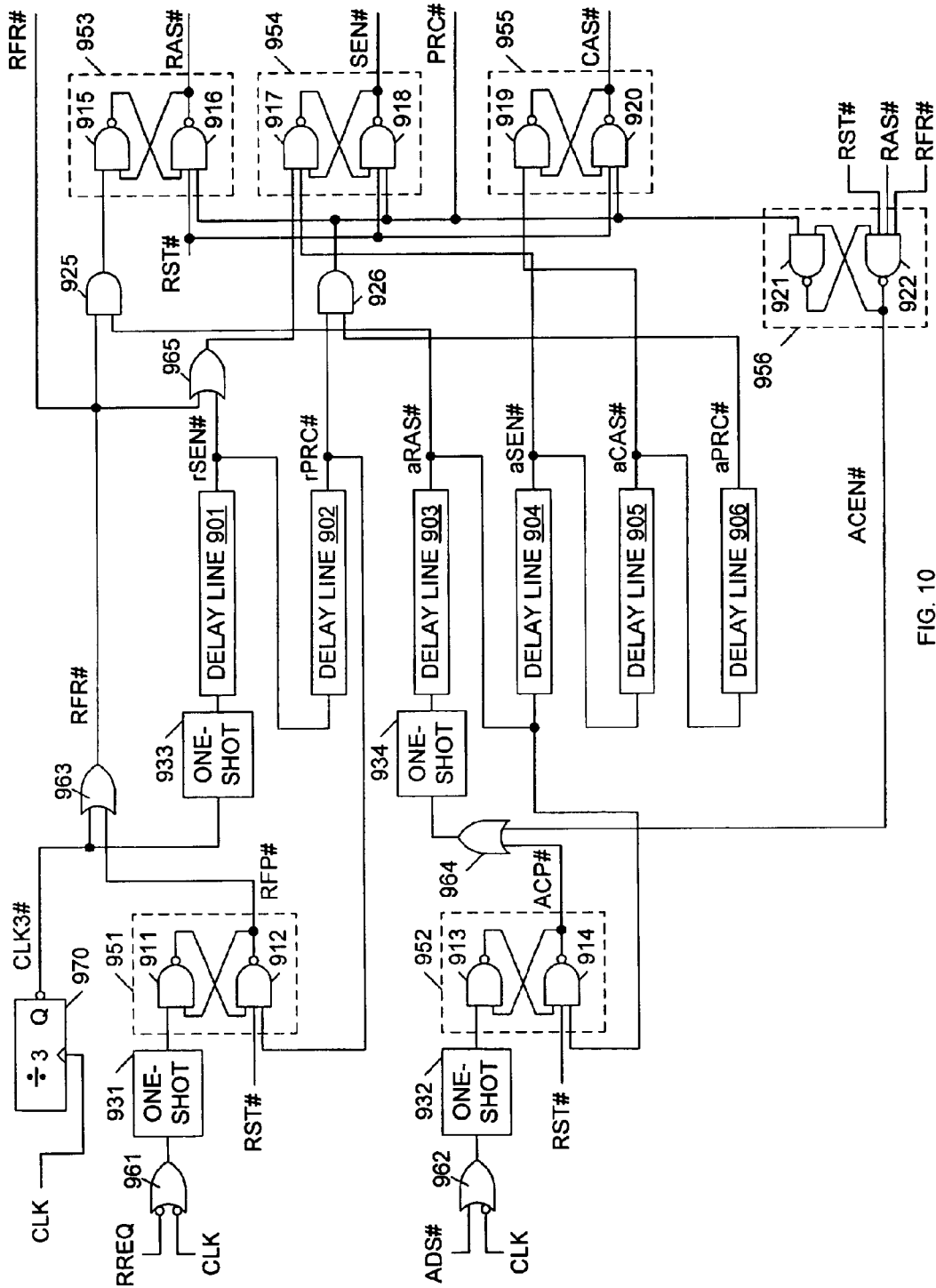
FIG. 10 is a circuit diagram of a memory access sequencer, which can be used in place of the memory access sequencer of FIG. 8, in accordance with another embodiment of the present invention, to support one refresh operation every three clock cycles.

FIG. 10 is a circuit diagram of a memory access sequencer 900, which can be used in place of memory access sequencer 701, in accordance with another embodiment of the present invention. In this embodiment, memory access sequencer 900 generates memory control timing signals which enable one refresh operation and three memory access operations to be performed in three clock cycles. Memory access sequencer 900 includes delay lines 901–906, set/reset flip-flops 951–956, one-shot circuits 931–934, OR gates 961–965, AND gates 925-926 and divide-by-3 counter 970. Flip flops 951–956 include cross-coupled NAND gates 911–922 as illustrated. OR gate 961, one-shot circuit 931 and flip-flop 951 operate in the same manner as OR gate 862, one-shot circuit 833 and flip-flop 853 of memory access sequencer 701 (FIG. 8). Thus, these elements drive the refresh pending signal RFP# low when the refresh request signal RREQ and the clock signal CLK are both high. Similarly, OR gate 962, one-shot circuit 932 and flip-flop 952 operate in the same manner as OR gate 861, one-shot circuit 832 and flip-flop 852 of memory access sequencer 701 (FIG. 8). Thus, these elements drive the access pending signal ACP# low when the address strobe signal ADS# is activated low and the clock signal CLK is high.

Divide-by-three counter 970 generates a periodic signal CLK3# having a frequency equal to one-third of the frequency of the CLK signal. The CLK#3 signal has a logic low state for one third of the CLK3# period, and a logic high state for two thirds of the CLK3# period. That is, the CLK3# signal has a low state for one period out of every three periods of the CLK signal. The CLK3# signal is applied to OR gate 963 and one-shot circuit 933. OR gate 963 activates the refresh control signal RFR# when the CLK3# signal has a low value and the refresh pending signal RFP# is activated low. Thus, the refresh control signal RFR# can only be activated low once every three cycles of the CLK period.

Flip-flops 953–955 generate the memory control timing signals RAS#, SEN#, and CAS#, respectively, in response to the RFR# signal and the output signals rSEN#, rPRC#, aRAS#, aCAS#, and aPRC# provided by delay lines 901, 902, 903, 904, 905 and 906, respectively.

At each falling edge of the CLK3# signal, one-shot circuit 933 applies a low-going pulse to the input terminal of delay line 901. This low-going pulse propagates through delay lines 901 and 902 to AND gate 926, thereby causing AND gate 926 to provide a logic low PRC# output signal, which resets flip-flop 956 and sets flip-flops 951 and 953–955. The pulse width can be 1 ns or another period sufficient to set or reset these flip-flops.

The input terminal of delay line 903 is connected to one-shot circuit 934, which generates a low-going pulse when both the access pending signal ACP# and the access enabled signal ACEN# provided by flip-flop 956 are activated low. The access enabled signal ACEN# provided by flip-flop 956 is activated low by the falling edge of the precharge signal PRC#. Therefore, when a memory access is pending (ACP# low), a low-going pulse is generated at the input of delay line 903 when the memory array 101 enters a precharge state. The precharge state is triggered by the falling edge of the PRC# signal, which is in turn triggered by a falling edge of either the refresh precharge signal rPRC# or the access precharge signal aPRC#. The access enable signal ACEN# is deactivated high when the memory enters a refresh cycle as indicated by the falling edge of the RFR# signal, or when the memory enters a memory access cycle as indicated by the falling edge of the RAS# signal. The access pending signal ACP# is deactivated high when the memory enters a memory access cycle signaled by the falling-edge of the aRAS# signal. The refresh pending signal RFP# is deactivated high when the memory is finishing a refresh operation signaled by the falling edge of the rPRC# signal.

The memory control signals RAS#, SEN#, CAS#, and PRC# are derived from the falling edges of the signals provided at the output terminals of delay lines 901–906. Accordingly, during a memory access cycle when the access pending signal ACP# is activated low, the RAS# signal is activated low by the falling edge of the aRAS# provided by delay line 903, the SEN# signal is activated low by the falling edge of the aSEN# signal provided by delay line 904, and the PRC# signal is activated low by the falling edge of the aPRC# signal provided by delay line 906. The activated signals RAS#, SEN#, and CAS# are deactivated in response to the falling edge of the PRC# signal.

Similarly, during a refresh cycle when refresh pending signal RFP# is activated low, both the refresh control signal RFR# and the RAS# signal are activated in response to the low state of the CLK3# signal, the SEN# signal is activated low by the falling edge of the rSEN# signal provided by delay line 901, and the PRC# signal is activated low by the falling edge of the rPRC# signal provided by delay line 902. The CAS# signal is not activated during a refresh cycle. During a refresh cycle, the RFR#, RAS# and SEN# signals are all deactivated high in response to the falling edge of the rPRC# signal.

When no memory access is pending, the access pending signal ACP# is deactivated high, thereby causing OR gate 964 to inhibit the aRAS#, aSEN#, aCAS# and aPRC# signals from being activated low. When no refresh is pending, the refresh pending signal RFP# is deactivated high, thereby causing both the RFR# signal and the output of OR gate 965 to have logic high values. As a result, the activation of the memory control signals RAS#, SEN#, CAS# and PRC# are inhibited. However, a low-going pulse is still generated by one-shot circuit 933 once every three periods of the CLK signal (at the falling edge of the CLK3# signal), and this pulse is propagated through delay lines 901 and 902 as the rSEN# and rPRC# signals.

Figure 11:
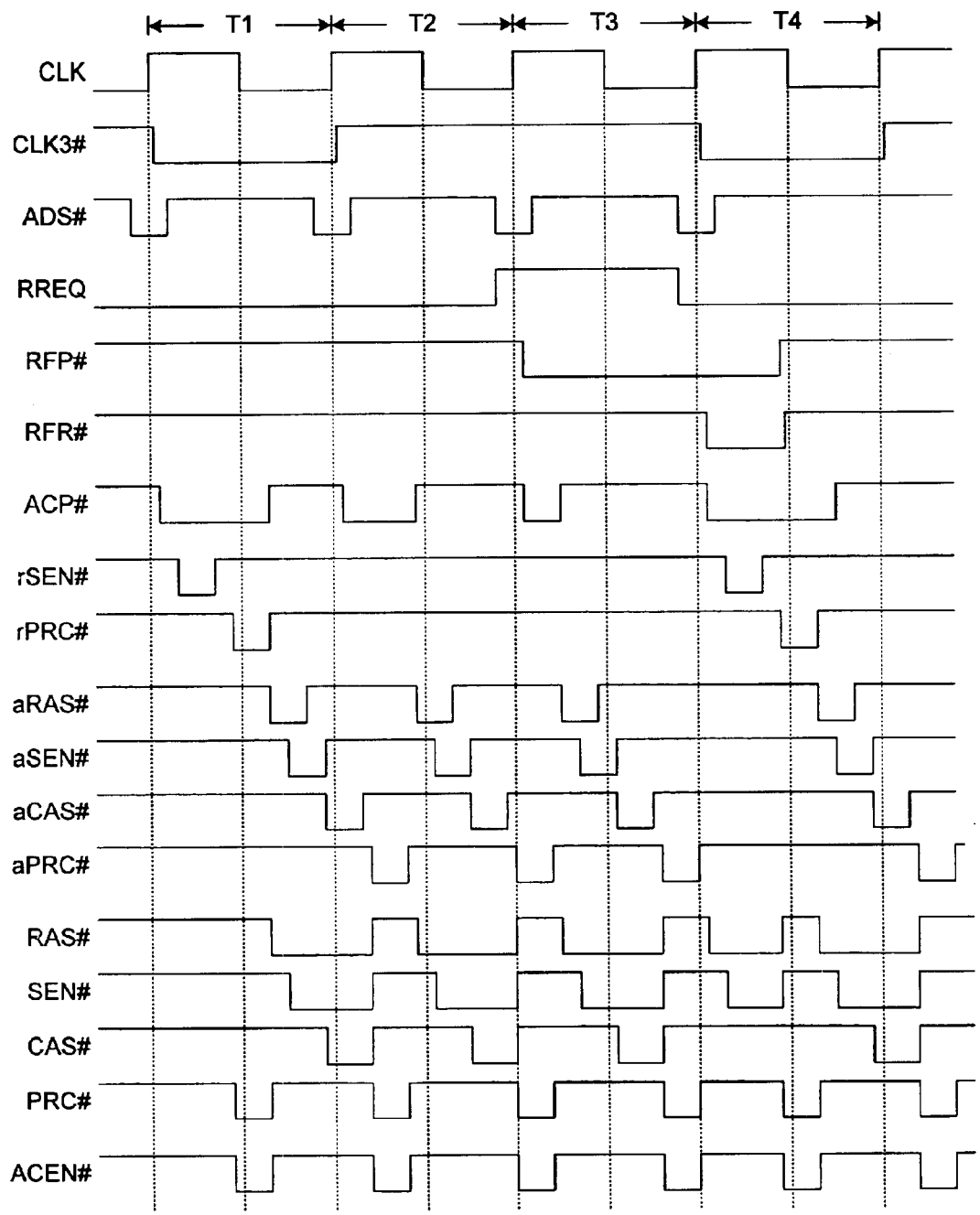
FIG. 11 is a waveform diagram illustrating the operation of the 1-T SRAM system of FIG. 7, when using the memory array sequencer of FIG. 10.

FIG. 11 is a waveform diagram illustrating the operation of 1-T SRAM system 700 when using memory array sequencer 900. A memory access occurs in each of the clock cycles T1–T4, as indicated by the ADS# signal, which is activated low prior to the rising edge of each of the clock cycles T1–T4. In addition, a refresh request is detected during cycle T3, and serviced with a memory refresh cycle during cycle T4.

At the beginning of cycle T1, the low state of the address strobe signal ADS# and the high state of the CLK signal causes the output of OR gate 962 to go low and a low-going pulse to appear at the output of one-shot circuit 932, thereby activating the access pending signal ACP# low. However, the high state of the access enable signal ACEN# inhibits the low state of the ACP# signal from propagating to one-shot circuit 934. In addition, the CLK3# signal goes low at the rising edge of cycle T1, thereby causing one-shot circuit 933 to apply a low-going pulse to the input terminal of delay line 901. This pulse is propagated through delay lines 901 and 902 to activate the rSEN# and rPRC# signals, respectively. The low state of the rPRC# signal causes AND gate 926 to provide a logic low value to flip-flop 956, thereby causing this flip-flop 956 to activate the access enable signal ACEN# low. The low states of the access enable signal ACEN# and the access pending signal ACP# cause OR gate 964 to provide a logic low output signal, thereby causing one-shot circuit 934 to generate a low-going pulse. This low-going pulse is propagated through delay lines 903 to 906 thereby sequentially activating and deactivating the aRAS#, aSEN#, aCAS# and aPRC# signals. The activated aRAS# signal causes AND gate 925 to provide a logic low output signal, thereby causing flip-flop 953 to activate the RAS# signal low. The activated aCAS# and aPRC# signals cause flip-flops 954 and 955 to activate the respective SEN# and CAS# signals low. The activated aPRC# signal causes AND gate 926 to provide a logic low output signal, activating the PRC# signal low, and causing flip-flops 953–955 to deactivate the RAS#, SEN# and CAS# signals high. The activated and deactivated RAS#, SEN#, CAS# and PRC# signals carry out a memory access cycle.

The activation of the RAS# signal also causes flip-flop 956 to de-activate the access pending signal ACEN# high, thus inhibiting the start of another access cycle until the current access cycle is completed. Because the memory access cycle is not started until the second half of the CLK cycle T1, even though the access cycle time is shorter than a CLK period, the current access cycle does not finish until well into cycle T2.

At the beginning of cycle T2, the low state of the address strobe signal ADS# and the high state of the CLK signal causes the access pending signal ACP# to be activated low. However, the high state of access enable signal ACEN# inhibits the low ACP# signal from propagating through OR gate 964 to one-shot device 934. Thus, the second memory access is not carried out until some time close to the second half of cycle T2, when the PRC# signal is activated low. When the PRC# signal is activated low, flip-flop 956 resets, and causes the ACEN# signal to go low. The low ACEN# signal, combined with the low ACP# signal, causes OR gate 964 to provide a low input signal to one-shot circuit 934, thereby causing one-shot circuit 934 to provide a low-going pulse. The low-going pulse provided by one-shot circuit 934 enables another set of access cycle timing signals aRAS#, aSEN#, aCAS# and aPRC# to be generated by delay lines 903–906. The activation of the RAS# signal again deactivates the access enable signal ACEN# high and inhibits the start of another memory access cycle until the current cycle is finished. Because the access cycle time is shorter than a clock period, the current access cycle is completed closer to the beginning of next clock cycle T3.

Prior the beginning of cycle T3, the refresh request signal RREQ is asserted high, thereby indicating the presence of a refresh request. In addition, the address strobe signal ADS# is activated low, thereby indicating the presence of a third consecutive access cycle. The high state of the refresh request signal RREQ causes OR gate 961 to provide a logic low signal to one-shot device 931 at the rising edge of the CLK signal. In response, one-shot device 931 provides a low-going pulse to flip-flop 951, thereby activating the refresh pending signal RFP# low. The low state of the address strobe signal ADS# causes OR gate 962 to provide a logic low signal to one-shot device 932 at the rising edge of the CLK signal. In response, one-shot device 932 provides a low-going pulse to flip-flop 952, thereby activating the access pending signal ACP# low. Because the CLK3# signal has a logic high state during cycle T3, OR gate 963 does not activate the refresh control signal RFR# during cycle T3. Thus, the refresh cycle is not performed during cycle T3. However, the memory access cycle initiated at the rising edge of cycle T3 is carried out in the manner described above for the first two memory access cycles. However, the memory access cycle initiated at the rising edge of cycle T3 is completed before the beginning of cycle T4.

At the beginning of cycle T4, the low state of the address strobe signal ADS# again causes the access pending signal ACP# to be activated low. Similar to the situation in cycle T1, the clock signal CLK3# transitions to a logic low state. At this time, the logic low CLK3# and RFP# signals cause OR gate 963 to activate the refresh control signal RFR# low. The low RFR# signal causes AND gate 925 to provide a low signal to flip-flop 953, thereby causing the RAS# signal to be activated low. The low state of the refresh control signal RFR# also causes flip-flop 956 to deactivate the access enable signal ACEN# high, thereby inhibiting the memory access initiated during cycle T4 from being carried out. The falling edge of the CLK3# signal also causes one-shot circuit 933 to generate a low-going pulse at the input of delay line 901. This pulse is propagated through delay line 901 as the rSEN#, and then through delay line 902 as the rPRC# signal. The falling edge of the rSEN# signal causes OR gate 965 to provide a logic low signal to flip-flop 954. In response, flip-flop 954 activates the SEN# signal low. The activation of the RAS# and SEN# signals causes a memory refresh cycle to be carried out. The falling edge of the rPRC# signal causes flip-flop 951 to deactivate the refresh pending signal RFP# high. The high RFP# signal, in turn, causes OR gate 963 to deactivate the refresh control signal RFR# high. The falling edge of the rPRC# signal also causes AND gate 926 to provide a logic low PRC# signal, thereby causing flip-flops 953 and 954 to deactivate the RAS# and SEN# signals high. The low state of the PRC# signal resets flip-flop 956, thereby causing the access enable signal ACEN# to be activated low.

At this time, the low states of the access enable signal ACEN# and the access pending signal ACP# cause OR gate 964 to provide a logic low signal to one-shot circuit 934. In response, one-shot circuit 934 generates a low-going pulse at the input of delay line 903. This pulse is propagated, in sequence, to the outputs of delay lines 903 to 906 activating the memory control signals to carry out the fourth memory access cycle.

In the foregoing manner, three memory access cycles and one refresh access cycle can be completed during three clock cycles. It is noted that the timing between the rising edge of the first clock cycle T1 and the memory control signals generated during the first clock cycle T1 is the same as the timing between the rising edge of the fourth clock cycle T4 and the memory control signals generated during the fourth clock cycle T4. Thus, the refresh operations can be completed once every three cycles of the CLK signal, without disrupting the external memory access operations.

Third Alternate Embodiment

Figure 12:
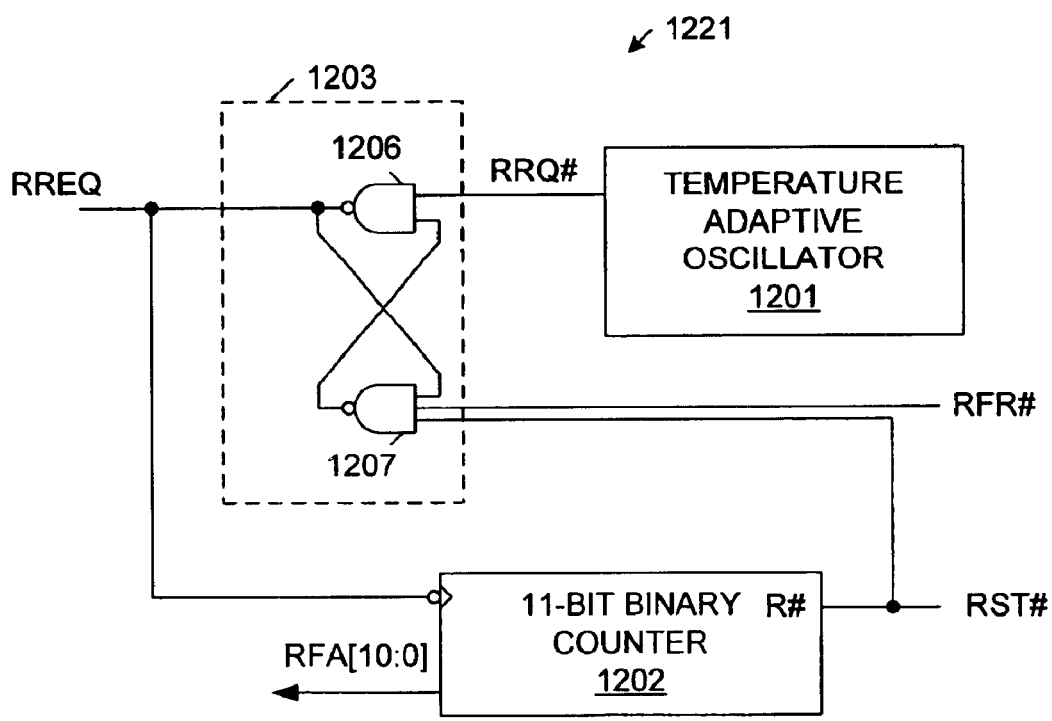
FIG. 12 is a block diagram of a temperature-adaptive refresh controller in accordance with another embodiment of the present invention.

FIG. 12 is a block diagram of a temperature-adaptive refresh controller 1221 in accordance with another embodiment of the present invention. Temperature-adaptive refresh controller 1221 is designed to operate with the memory devices described above in connection with FIGS. 1–11. Thus, temperature-adaptive refresh controller 1221 is used in place of the above-described refresh controller 121 (FIGS. 1–2 and 7). The temperature-adaptive refresh controller 1221 consists of a temperature-adaptive oscillator 1201, a sequential logic element 1203 formed by cross-coupled NAND gates 1206–1207, and an 11-bit binary counter 1202. In the described embodiment, sequential logic element 1203 is a set-reset flip-flop.

Temperature-adaptive refresh controller 1221 generates the periodic refresh request signal RREQ, which is used to control the refresh operations of memory system 100. More specifically, temperature-adaptive oscillator 1201 periodically generates a negative pulse RRQ# in the manner described below. The negative pulse RRQ# generated by temperature-adaptive oscillator 1201 is asynchronous with the external clock signal CLK (which synchronizes the operation of memory device 100). Sequential logic element 1203 enables the asynchronous negative pulse RRQ# provided by temperature-adaptive oscillator 1201 to be held, as a logic high refresh request signal RREQ. This enables the associated memory array sequencer (e.g., memory array sequencer 122, 701, or 900) to properly detect the logic high RREQ signal at a rising edge of the external clock signal CLK. Stated another way, sequential logic element 1203 ensures that the asynchronous negative pulse RRQ# is properly synchronized with the external clock signal CLK.

Sequential logic element 1203 and 11-bit binary counter 1202 are both reset when the reset signal RST# is activated low during the initialization of memory system 100. Thus, refresh request signal RREQ initially has a logic "0" value, and the refresh address RFA[10:0] initially has a value of [000 0000 0000]. The reset signal RST# is subsequently deactivated high for the normal operation of memory system 100. During normal operation, temperature-adaptive oscillator 1201 periodically pulses the RRQ# signal low. The logic low RRQ# signal sets sequential logic element 1203, such that this element 1203 provides a logic high refresh request signal RREQ. The logic high refresh request signal RREQ is provided to the associated memory array sequencer. As described above, the associated memory array sequencer causes a refresh operation to be performed in response to the logic high refresh request signal RREQ. When the refresh operation is initiated, the associated memory array sequencer activates the refresh control signal RFR# low, in the manner described above.

The logic low refresh control signal RFR# is applied to NAND gate 1207, thereby resetting sequential logic element 1203. As a result, sequential logic element 1203 provides a logic low refresh request signal RREQ. Binary counter 1202 is incremented to the next refresh address in response to this logic low refresh request signal RREQ. In this manner, temperature-adaptive refresh controller 1221 implements a simple request-acknowledge asynchronous handshake with the associated memory array sequencer.

The above-described process repeats, such that the associated memory array is periodically refreshed in response to the RRQ# signal. Temperature-adaptive oscillator 1201 thereby sets the refresh period between two refresh operations. Temperature-adaptive oscillator 1201 is designed such that the period of the RRQ# signal (i.e., the period between the low RRQ# pulses) decreases as the temperature increases (and increases as the temperature decreases). Stated another way, the frequency at which temperature-adaptive oscillator 1201 activates the RRQ# signal increases as the temperature increases (and decreases as the temperature decreases).

Note that as the temperature increases, the data retention time of the memory cells in array 101 decreases. For example, assume that each of the memory cells in memory array 101 is a DRAM cell that includes an access transistor and an associated storage capacitor. The increased temperature causes the subthreshold leakage current of the access transistor to increase exponentially, and causes the p-n junction leakage current at the drain of the access transistor, which is coupled to the storage capacitor, to increase exponentially. As this subthreshold leakage and p-n junction leakage exponentially increase, the data retention time exponentially decreases. Thus, the temperature-adaptive refresh controller 1221 advantageously exponentially increases the frequency of refresh operations as the data retention time of the memory cells decreases, thereby ensuring that the memory cells are properly refreshed.

Temperature-Adaptive Oscillator

Figure 13:
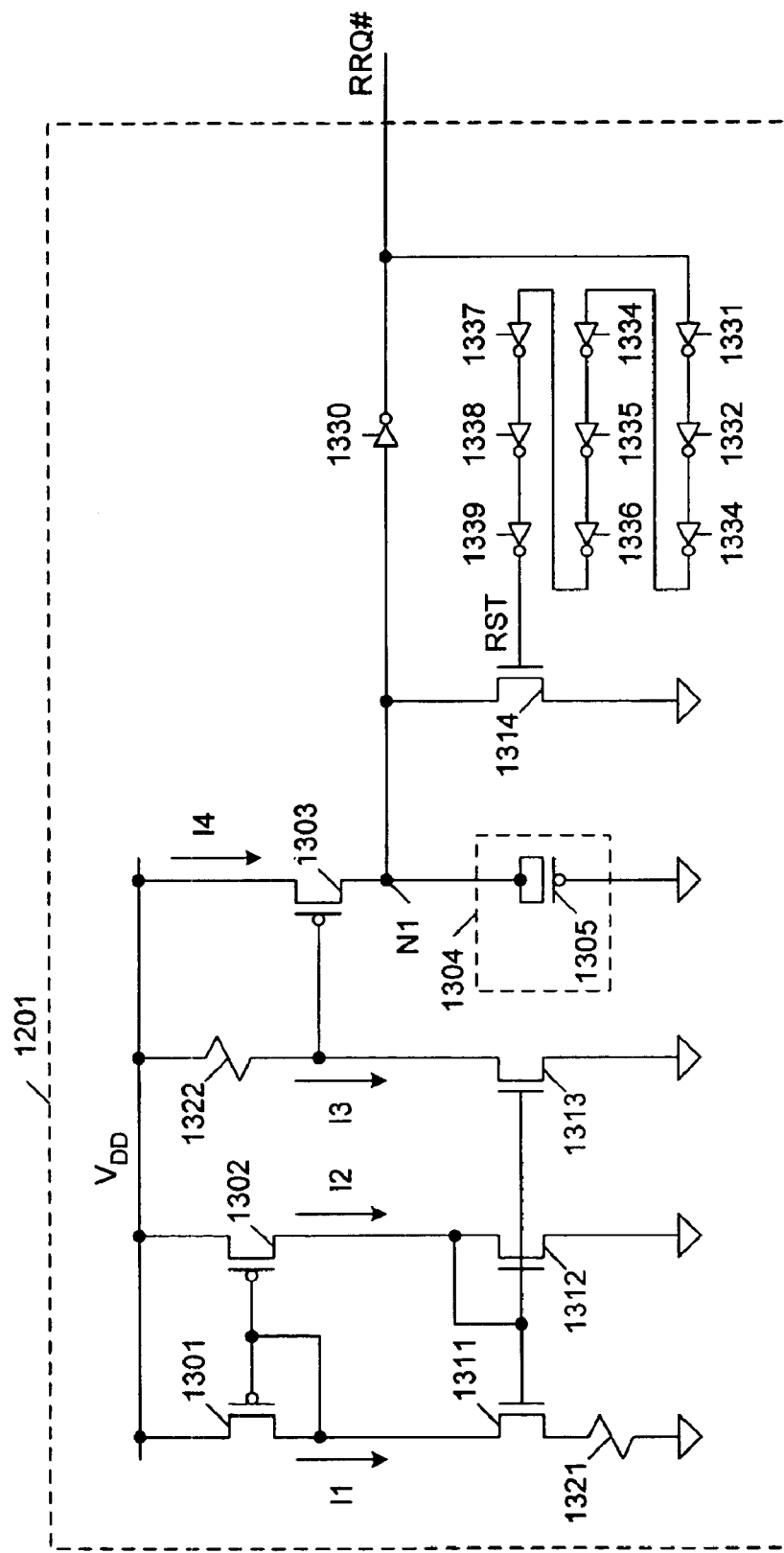
FIG. 13 is a circuit diagram of the temperature-adaptive oscillator of FIG. 12 in accordance with one embodiment of the present invention.

FIG. 13 is a circuit diagram of temperature-adaptive oscillator 1201 in accordance with one embodiment of the present invention. In this embodiment, temperature-adaptive oscillator 1201 includes p-channel transistors 1301–1303, capacitor element 1304, n-channel transistors 1311–1314, resistors 1321–1322, inverters 1330–1339 and node N1. Capacitor element 1304 can be, for example, a p-channel transistor 1305 having a gate coupled to the ground supply terminal, and source/drain regions commonly connected to the drain of node N1. The voltage on node N1 is designated voltage $V_{N1}$.

The sources of p-channel transistors 1301–1303 are all coupled to the $V_{DD}$ voltage supply terminal. The gates of p-channel transistors 1301–1302 are commonly connected to the drain of p-channel transistor 1301. The drain of n-channel transistor 1311 is coupled to the drain of p-channel transistor 1301. Resistor 1321 is connected between the source of n-channel transistor 1311 and the ground supply terminal.

The drain of n-channel transistor 1312 is coupled to the drain of p-channel transistor 1302, and the source of n-channel transistor 1312 is coupled to the ground supply terminal. Resistor 1322 is coupled to the $V_{DD}$ voltage supply terminal, and the other terminal of resistor 1322 is coupled to the gate of p-channel transistor 1303 and the drain of n-channel transistor 1313. The source of n-channel transistor 1313 is coupled to the ground supply terminal. The gates of n-channel transistors 1311–1313 are commonly connected to the drain of n-channel transistor 1312.

The drain of p-channel transistor 1303 is coupled to node N1. Capacitor element 1304 is connected between node N1 and the ground supply terminal. N-channel transistor 1314 is coupled between node N1 and the ground supply terminal. Inverters 1330–1339 are connected in series between node N1 and the gate of n-channel transistor 1314. Although ten inverters are used in the present embodiment, it is understood that other even numbers of inverters may be used in other embodiments. The output terminal of inverter 1330 is configured to provide the RRQ# signal.

In the foregoing manner, the elements of temperature-adaptive oscillator 1201 are configured to form a monostable vibrator, which periodically generates a negative output pulse, RRQ#. As described in more detail below, P-channel MOS transistor 1303 is biased such that a subthreshold current I4 flows through this transistor to charge capacitor element 1304. When capacitor element 1304 has been charged to a voltage that exceeds the trip point of inverter 1330, the RRQ# signal is activated low. The trip point of inverter 1330 is designated as the voltage, $V_{TRIP}$. The low state of the RRQ# signal propagates through an inverter chain that includes inverters 1331–1339, and results in a logic high signal being applied to the gate of n-channel transistor 1314. The signal applied to the gate of n-channel transistor 1314 is labeled as the reset signal RST. The high RST signal turns on n-channel transistor 1314, thereby pulling down the voltage on node N1 to the ground supply voltage. As a result, the RRQ# signal is deactivated high and the RST signal is subsequently deactivated low.

N-channel transistor 1314 is designed such that this transistor, when turned on, can sink a current much larger than the subthreshold current through p-channel transistor 1303. In one embodiment, turned-on transistor 1314 is able to sink about 500 times or more current than the subthreshold current through p-channel transistor 1303. As a result, voltage on node N1 is quickly discharged to a voltage close to the ground supply voltage when n-channel transistor 1314 is turned on.

The process then repeats with capacitor element 1304 charging and discharging, and the RRQ# signal being periodically activated low. Because capacitor element 1304 discharges much faster than capacitor element 1304 charges, the period of the RRQ# signal is determined mainly by the charging time of capacitor element 1304. More specifically, the period at which the RRQ# signal is deactivated high is determined by the subthreshold current of p-channel transistor 1303, the size of capacitor element 1304, and the switching threshold of inverter 1330. The duration of the period when the RRQ# signal is activated low is determined mainly by the delay through inverter chain 1330–1339. The duration of the period when the RRQ# signal is activated low, however, is much shorter than the duration of the period when the RRQ# signal is deactivated high. The period of the RRQ# signal is therefore mainly determined by the charging of capacitor element 1304.

Because the subthreshold current of p-channel transistor 1303 increases as temperature increases, the frequency at which the RRQ# signal is activated similarly increases as temperature increases. Stated another way, the period of the RRQ# signal decreases as the temperature increases. The period of the RRQ# signal can be designated by the variable $T_{RRQ\#}$.

In the present embodiment, the memory cells of memory array 101 are implemented using p-channel transistors. Thus, the subthreshold current of p-channel MOS transistor 1303 exhibits a relatively close tracking with the subthreshold leakage and p-n junction leakage of the memory cells. As a result, the period of the RRQ# signal (i.e., the self-refresh period of memory system 100) obtains a relatively close tracking with the data retention time of the memory cells.

In another embodiment, where n-channel MOS transistors are used to implement the memory cells in memory array 101, temperature-adaptive oscillator 1201 can be modified, such that the RRQ# signal is periodically activated in response to the subthreshold current through an n-channel transistor.

The subthreshold biasing of p-channel transistor 1303 will now be described in more detail. The biasing of p-channel transistor 1303 is facilitated by resistor 1322 and a current source formed by p-channel transistors 1301–1302, n-channel transistors 1311–1313 and resistor 1321. P-channel transistors 1301 and 1302 are identical transistors configured as a current mirror, such that the current I1 through p-channel transistor 1301 (and n-channel transistor 1311) is equal to the current I2 through p-channel transistor 1302 (and n-channel transistor 1312). The current I1 through resistor 1321 is equal to the gate-to-source voltage of transistor 1312 ($V_{GS1312}$) minus the gate-to-source voltage of transistor 1311 ($V_{GS1311}$), divided by the resistance of resistor 1321 ($R_{1321}$), or ($V_{GS1312} - V_{GS1311})/R_{1321}$.

By making the size of n-channel transistor 1313 equal to the size of n-channel transistor 1312, the current I3 through transistor 1313 is equal to the current I2 (or I1). As a result, the voltage drop across resistor 1322 is equal to the current I2 multiplied by the resistance ($R_{1322}$) of resistor 1322. This voltage drop, which is also equal to the gate-to-source voltage ($V_{GS1303}$) of p-channel transistor 1303, can therefore be expressed as ($V_{GS1312} - V_{GS1311}) \times R_{1322}/R_{1321}$. In the described embodiment, $R_{1322}$ is equal to $R_{1321}$, such that $V_{GS1303}$ is equal to ($V_{GS1312} - V_{GS1311}$), which is independent of the threshold voltages of the various transistors. Advantageously, the gate-to-source voltage $V_{GS1303}$ of transistor 1303 can be made substantially smaller than the threshold voltage of transistor 1303. Furthermore, if the channel lengths of n-channel transistors 1311 and 1312 are equal, then the time period between the RRQ# signal being activated low can be controlled by properly selecting the channel widths of n-channel transistors 1311 and 1312, the size of capacitor element 1304 and the size of p-channel transistor 1303.

In the foregoing manner, transistors 1301–1303, 1311–1313 and resistors 1321–1322 form a constant transconductance current source, which provides the subthreshold current I4. A constant transconductance current source is defined as a current source that provides a current through a transistor having a transconductance that is determined by geometric ratios, independent of power-supply voltages, process parameters, temperature or other parameters that exhibit a large variability. Constant transconductance current sources are described in more detail in "Analog Integrated Circuit Design," by David A. Johns and Ken Martin, John Wiley and Sons Inc., 1997, Chapter 5, pp. 248–250.

Assuming that the period of the RRQ# signal is predominantly determined by the charging of capacitor element 1304, then this time period ($T_{RRQ\#}$) can be defined by the following equation.

$$T_{RRQ\#} = C \times V_{TRIP}/I4 \quad (1)$$

Where C is the capacitance of capacitor element 1304, and $V_{TRIP}$ is the trip point voltage of inverter 1330 (i.e., the voltage that causes inverter 1330 to provide a logic low output signal).

Because the capacitance C and trip point $V_{TRIP}$ are relatively constant, it is seen that the period $T_{RRQ\#}$ is inversely related to the current I4. As described above, the current I4 exponentially increases as the temperature increases (and exponentially decreases as temperature decreases). As a result, the period $T_{RRQ\#}$ exponentially decreases as temperature increases (and exponentially increases as temperature decreases).

Figure 14:
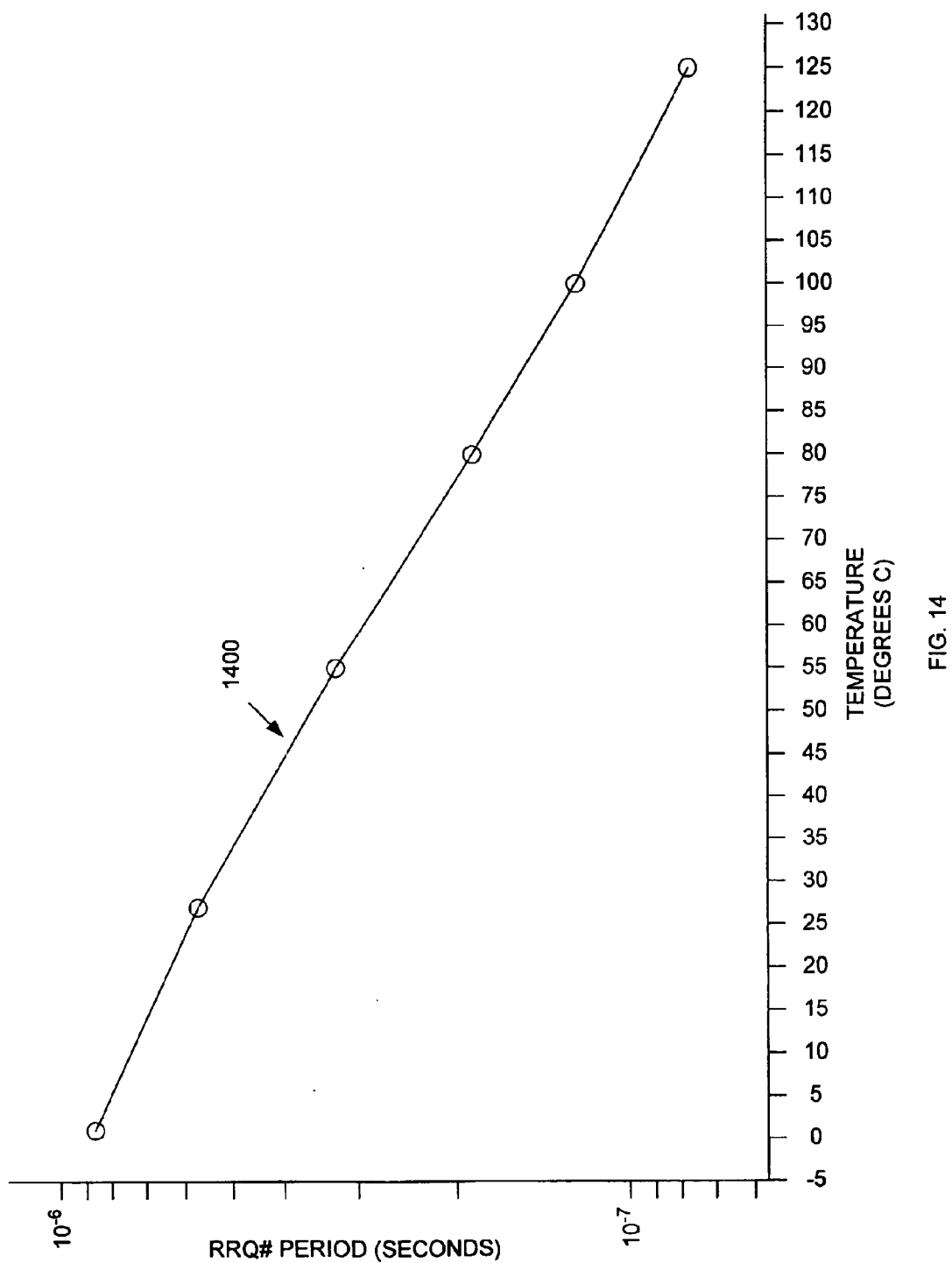
FIG. 14 is a graph that illustrates the period at which the RRQ# signal is activated low ($T_{RRQ\#}$) (on a logarithmic scale), as a function of temperature (on a linear scale).
Figure 15:
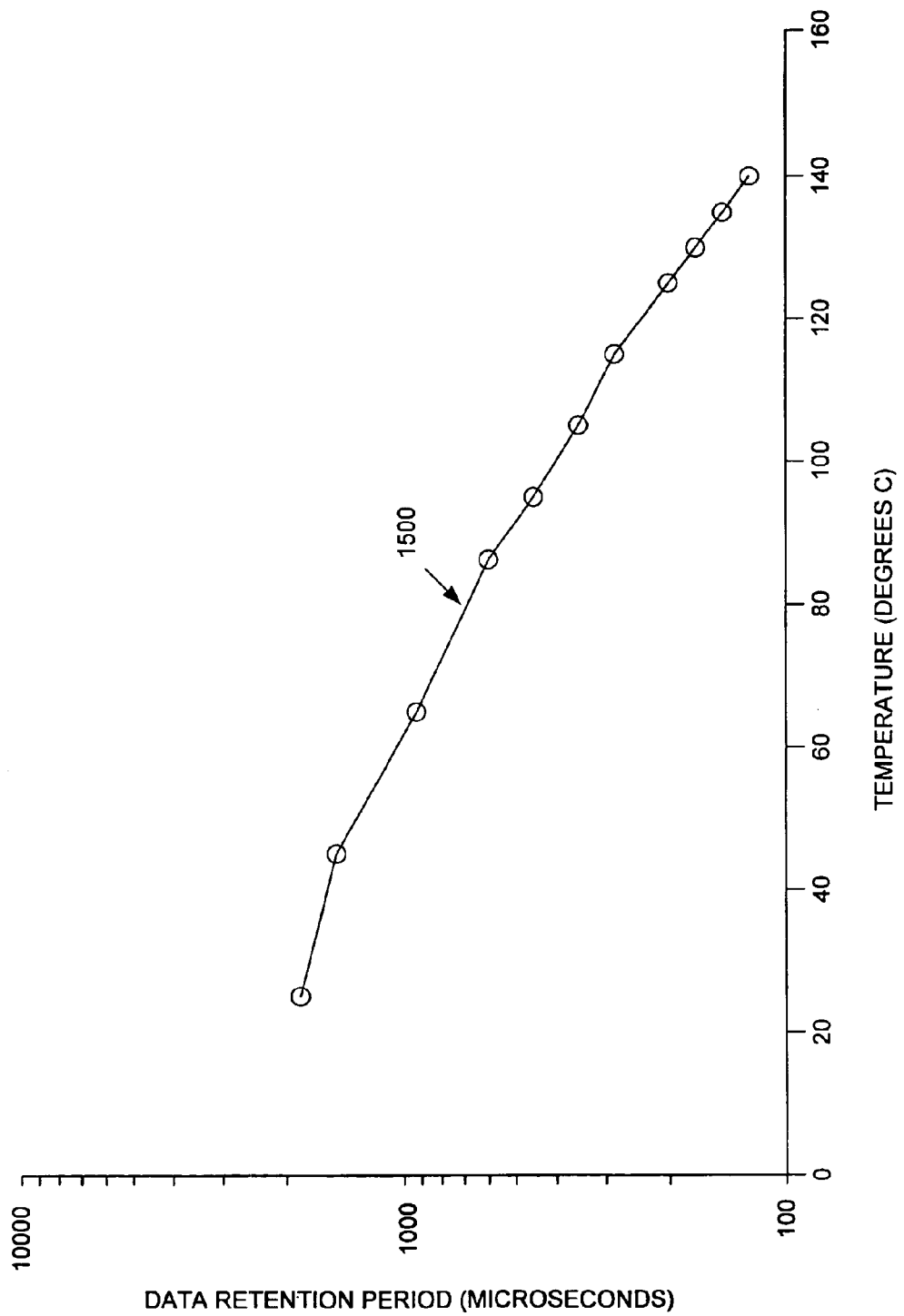
FIG. 15 is a graph that illustrates the measured data retention time of a DRAM memory cell (on a logarithmic scale), as a function of temperature (on a linear scale).

FIG. 14 is a graph 1400 that illustrates the period of the RRQ# signal low ($T_{RRQ\#}$) (on a logarithmic scale), as a function of temperature (on a linear scale). The graph 1400 of FIG. 14 was obtained using a SPICE simulation. FIG. 15 is a graph 1500 that illustrates the measured data retention time of a DRAM memory cell (on a logarithmic scale), as a function of temperature (on a linear scale). Both graphs 1400 and 1500 clearly show a linear relationship. Note that a linear relationship on the logarithmic scale represents an exponential relationship on a linear scale. In the described embodiment, the oscillation period ($T_{RRQ\#}$) is chosen to be more than 2048 times faster than the measured data retention time. The higher frequency of oscillation allows a more stable oscillator to be designed. This is because the higher frequency (lower ΔT) enables the use of a higher subthreshold current I4 through p-channel transistor 1303. As a result, the oscillation period is less susceptible to parasitic capacitance variations. The higher oscillation frequency works well with a distributed refresh scheme, in which only one row of memory cells is refreshed each time the RRQ# signal is activated. Because the memory array 101 has 2048 rows in the present embodiment, a total of 2048 oscillation periods are required to complete the refresh of all the memory cells in the memory array. The self-refresh period is therefore 2048 times the oscillation period of the temperature-adaptive oscillator 1201.

Figure 16A:
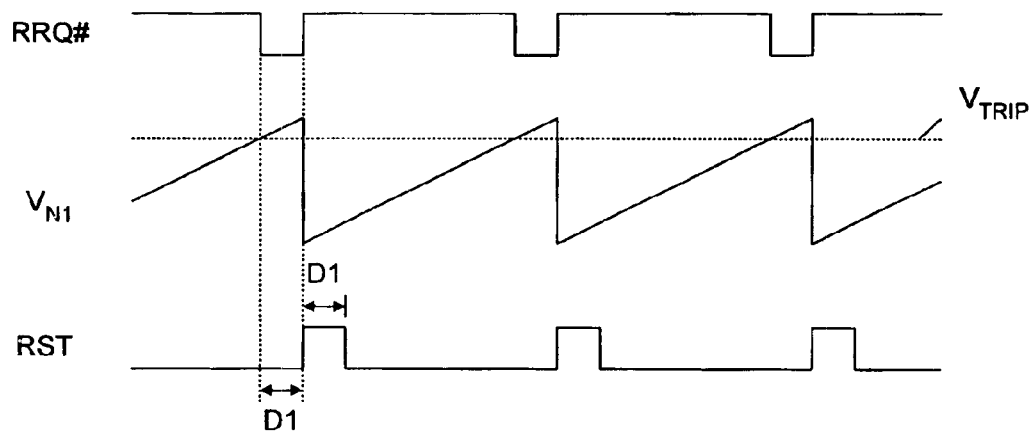
FIGS. 16A and 16B are waveform diagrams illustrating a refresh request signal RRQ#, a voltage on node N1 ($V_{N1}$), and a reset signal RST of the temperature-adaptive refresh controller of FIG. 12, in accordance with various embodiments of the present invention.

FIG. 16A is a waveform diagram illustrating the refresh request signal RRQ#, the voltage on node N1 ($V_{N1}$), and the reset signal RST. FIG. 16A assumes that capacitor element 1304 is a conventional capacitor. As illustrated in FIG. 16A, the current I4 charges capacitor element 1304 until the voltage $V_{N1}$ exceeds the trip point of inverter 1330. At this time, the refresh request signal RRQ# is activated low. The logic low refresh request signal RRQ# then propagates through inverters 1331–1339, with a delay D1. At the end of this delay D1, inverter 1339 applies a logic high reset signal RST to the gate of n-channel transistor 1314, thereby turning on this transistor 1314. The turned-on transistor 1314 discharges capacitor element 1304, thereby pulling down the voltage $V_{N1}$ on node N1 to the ground supply voltage. When the voltage $V_{N1}$ drops below the trip point of inverter 1330, the refresh request signal RRQ# is deactivated high. The logic high refresh request signal RRQ# then propagates through inverters 1331–1339, with a delay D1. At the end of this delay D1, inverter 1339 applies a logic low reset signal RST to the gate of n-channel transistor 1314, thereby turning off this transistor 1314, and allowing capacitor element 1304 to begin charging again.

Figure 16B:
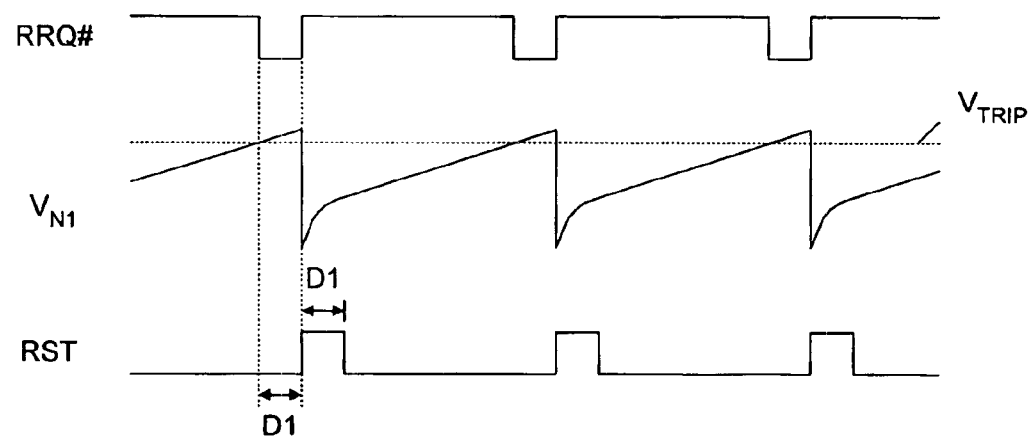

FIG. 16B is a waveform diagram illustrating the refresh request signal RRQ#, the voltage on node N1 ($V_{N1}$), and the reset signal RST. FIG. 16B assumes that capacitor element 1304 is a p-channel MOS transistor, connected in the manner illustrated by transistor 1305 in FIG. 13. As illustrated in FIG. 16B, the refresh request signal RRQ#, the voltage $V_{N1}$ and the reset signal RST are generated in substantially the same manner illustrated in FIG. 16A. However, PMOS transistor 1305 charges relatively quickly until the voltage $V_{N1}$ on node N1 reaches the threshold voltage $V_{TP}$ of PMOS transistor 1305. When the voltage $V_{N1}$ exceeds this threshold voltage $V_{TP}$, the PMOS transistor 1305 charges more slowly. The refresh request signal RRQ# and the reset signal RST are generated in response to the voltage $V_{N1}$, in the same manner described above in connection with FIG. 16A.

Although the invention has been described in connection with several embodiments, it is understood that this invention is not limited to the embodiments disclosed, but is capable of various modifications, which would be apparent to a person skilled in the art. For example, although the read/write accesses have been described as occurring during the first half of a clock cycle, and the refresh operations have been described as occurring during the second half of a clock cycle, it is understood that this order may be reversed in other embodiments. The manner of performing this reversal would be apparent to one of ordinary skill in the art. Furthermore, although the refresh operations have been described as not activating the CAS# signal, it is understood that the CAS# signal may be activated during refresh operations in other embodiments. Moreover, although the above-described memory array sequencers are initially reset by the RST# signal, it is understood that these memory array sequencers are capable of resetting themselves in the absence of the RST# signal. In addition, the DRAM memory banks can have different sizes in different embodiments. Similarly, different numbers of DRAM banks can be used. Moreover, buses having different widths than those described can be used in other embodiments. In addition, different logic can be used to provide the same results. Moreover, although the temperature-adaptive self-refresh controller 1221 has been described in connection with use with 1T SRAM memory system 100, it is understood that with minor modifications, this self-refresh controller 1221 can also be used in synchronous DRAM or other DRAM devices. Thus, the invention is limited only by the following claims.

We claim:

1. A memory system comprising:
an array of memory cells, wherein each of the memory cells must be periodically refreshed to retain a data value; and
a refresh control circuit that includes a temperature-adaptive oscillator for selecting a refresh period for refreshing the memory cells, wherein the temperature-adaptive oscillator is configured to select the refresh period in response to the subthreshold current of a reference transistor, wherein the temperature-adaptive oscillator comprises a capacitor element configured to be charged in response to the subthreshold current of the reference transistor.

2. The memory system of claim 1, further comprising an inverter chain coupled to the capacitor element, wherein the inverter chain is activated when a control voltage on the capacitor element exceeds a trip point of the inverter chain, and wherein the inverter chain provides a first refresh control signal used to control the refresh of the memory cells.

3. The memory system of claim 2, further comprising a reset transistor having a gate coupled to the inverter chain, a source coupled to ground and a drain coupled to the capacitor element, wherein the reset transistor is turned on after the inverter chain is activated, thereby discharging the capacitor element.

4. The memory system of claim 1, wherein the capacitor element comprises a p-channel MOS transistor having commonly connected source/drain regions.

5. The memory system of claim 1, further comprising a bias circuit coupled to the reference transistor, wherein the bias circuit is configured to cause the subthreshold current to flow through the reference transistor.

6. The memory system of claim 5, wherein the bias circuit comprises a first transistor and a second transistor, wherein the subthreshold current is a function of the width of the first transistor and the width of the second transistor.

7. The memory system of claim 1, wherein the reference transistor is of the same conductivity type as transistors used in the memory cells.

8. The memory system of claim 2, wherein the refresh control circuit further comprises a sequential logic element configured to receive the refresh control signal, and in response, activate a refresh request signal when the refresh control signal is activated.

9. The memory system of claim 8, wherein the sequential logic element is coupled to receive a second refresh control signal that indicates that the refresh operation has been performed, wherein the sequential logic element is configured to deactivate the refresh request signal in response to the second refresh control signal.

10. The memory system of claim 9, wherein the refresh control circuit includes a counter which is incremented in response to the activated or deactivated refresh request signal, the counter providing a refresh address that identifies a subset of the memory cells to be refreshed.

11. The memory system of claim 1, further comprising a constant transconductance current source for biasing the reference transistor.

12. A method of operating a memory system, the method comprising:
periodically activating a refresh control signal by charging a capacitor element in response to a subthreshold current through a reference transistor, wherein the subthreshold current varies with temperature; and
refreshing an array of memory cells in response to the refresh control signal, wherein each of the memory cells must be periodically refreshed to retain a data value.

13. The method of claim 12, further comprising activating the refresh control signal when the capacitor element is charged to a voltage greater than a trip point voltage.

14. The method of claim 13, further comprising:
introducing a delay to the activated refresh control signal, thereby creating a delayed activated refresh control signal; and discharging the capacitor element in response to the delayed activated refresh control signal.

15. The method of claim 13, further comprising deactivating the refresh control signal when the capacitor element is discharged to a voltage less than a trip point voltage.

16. The method of claim 12, further comprising setting a sequential logic element in response to the activated refresh control signal, whereby the sequential logic element activates a refresh request signal.

17. The method of claim 16, further comprising performing a refresh access to a subset of the memory cells in response to the activated refresh request signal.

18. The method of claim 17, further comprising:
operating the memory system in response to a clock signal; and
enabling N external accesses and one refresh access to be consecutively performed during N cycles of the clock signal, wherein N is an integer equal to two or more.

19. The method of claim 17, further comprising activating a second refresh control signal when the subset of the memory cells is refreshed.

20. The method of claim 19, further comprising resetting the sequential logic element in response to the activated second refresh control signal, whereby the sequential logic element deactivates the refresh request signal.

21. The method of claim 20, further comprising modifying a refresh address counter in response to the deactivated refresh request signal.

22. A memory system comprising:
an array of memory cells, wherein each of the memory cells must be periodically refreshed to retain a data value; and
a refresh control circuit that includes:
  a constant transconductance current source configured to provide a subthreshold current through a reference transistor;
  a capacitor element configured to be charged in response to the subthreshold current provided by the constant transconductance current source;
  an inverter chain having an input terminal coupled to the capacitor element and an output terminal configured to provide a refresh control signal; and
  a reset transistor coupled between the capacitor element and a voltage supply terminal, the reset transistor having a control terminal coupled to an output terminal of the inverter chain.

23. The memory system of claim 22, wherein the reset transistor is larger than the reference transistor.

24. The memory system of claim 22, wherein the refresh control circuit further comprises a sequential logic element configured to receive the refresh control signal, and in response, provide a refresh request signal.

* * * * *